United States Patent
Burgener, II et al.

(10) Patent No.: US 7,172,813 B2
(45) Date of Patent: Feb. 6, 2007

(54) ZINC OXIDE CRYSTAL GROWTH SUBSTRATE

(76) Inventors: Robert H. Burgener, II, 418 W. Winchester St., Murray, UT (US) 84107; Roger L. Felix, 2391 N. 180 West, Pleasant Grove, UT (US) 84062; Gary M. Renlund, 2094 E. Worchester Dr., Salt Lake City, UT (US) 84121

( * ) Notice: Subject to any disclaimer, the term of this patent is extended or adjusted under 35 U.S.C. 154(b) by 4 days.

(21) Appl. No.: 10/849,332

(22) Filed: May 19, 2004

(65) Prior Publication Data
US 2004/0234823 A1    Nov. 25, 2004

Related U.S. Application Data

(60) Provisional application No. 60/560,427, filed on Apr. 8, 2004, provisional application No. 60/488,677, filed on Jul. 18, 2003, provisional application No. 60/471,916, filed on May 20, 2003.

(51) Int. Cl.
  *B32B 9/04*    (2006.01)
(52) U.S. Cl. ............ 428/446; 428/448; 428/689; 428/699; 428/701; 428/702
(58) Field of Classification Search ............ 428/446, 428/448, 689, 699, 701, 702
See application file for complete search history.

(56) References Cited

U.S. PATENT DOCUMENTS 3,664,867 A  *  5/1972  Galli et al. .................. 428/336
3,713,822 A  *  1/1973  Kiess ........................... 430/87
3,836,876 A  *  9/1974  Marshall et al. ............ 333/111
3,864,725 A     2/1975  Merrin
4,399,441 A  *  8/1983  Vaughan et al. ............. 342/50

(Continued)

FOREIGN PATENT DOCUMENTS

EP    1215310    6/2002

(Continued)

OTHER PUBLICATIONS

Itani, Kenya, et al., "Low-Dislocation-Density GaAs Wafers Grown by Vertical Gradient Freeze Process, Suitable for Mass Production of Semiconductor Lasers," Hitachi Cable Review No. 20, Aug. 2001, pp. 35-38.

(Continued)

*Primary Examiner*—Jennifer C. McNeil
*Assistant Examiner*—Timothy M. Speer
(74) *Attorney, Agent, or Firm*—Kirton & McConkie; Evan R. Witt

(57) ABSTRACT

A zinc oxide crystal growth substrate is disclosed. The zinc oxide crystal growth substrate includes a thin layer of single crystal zinc oxide deposited on an self supporting substrate surface by a chemical deposition process. The chemical deposition process is selected from RF sputtering, CVD (chemical vapor deposition), MOCVD (metal organic chemical vapor deposition), spin coating, electrophoresis, and hydrothermal growth processes. The self supporting substrate may be amorphous, polycrystalline, or crystalline. The thin layer of zinc oxide has a crystal lattice which permits the crystal growth of a crystal compatible with zinc oxide. The compatible crystal has a lattice parameter within about 5% of a corresponding lattice parameter of the zinc oxide.

33 Claims, 7 Drawing Sheets

U.S. PATENT DOCUMENTS

| | | | |
|---|---|---|---|
| 5,331,655 | A | 7/1994 | Harder et al. |
| 5,852,702 | A * | 12/1998 | Nishida et al. ............. 385/130 |
| 6,057,561 | A | 5/2000 | Kawasaki et al. |
| 6,291,085 | B1 | 9/2001 | White et al. |
| 6,342,313 | B1 | 1/2002 | White et al. |
| 6,410,162 | B1 | 6/2002 | White et al. |
| 6,475,825 | B2 | 11/2002 | White et al. |
| 6,527,858 | B1 | 3/2003 | Yoshida et al. |
| 6,589,362 | B2 | 7/2003 | Haga |
| 6,610,141 | B2 | 8/2003 | White et al. |
| 6,617,183 | B2 | 9/2003 | Kadota et al. |
| 6,624,441 | B2 | 9/2003 | Cantwell et al. |
| 6,664,565 | B1 | 12/2003 | Sano et al. |
| 6,673,478 | B2 | 1/2004 | Kato et al. |
| 6,707,074 | B2 | 3/2004 | Yoshii et al. |
| 6,733,895 | B2 | 5/2004 | Kadota et al. |
| 6,838,308 | B2 | 1/2005 | Haga |
| 2003/0226499 | A1 | 12/2003 | Teherani |
| 2004/0061114 | A1 | 4/2004 | Yan et al. |
| 2004/0099876 | A1 | 5/2004 | Niki et al. |
| 2004/0108505 | A1 | 6/2004 | Tuller et al. |
| 2004/0175860 | A1 | 9/2004 | Park et al. |

FOREIGN PATENT DOCUMENTS

| | | |
|---|---|---|
| EP | 1219731 A1 * | 7/2002 |
| JP | 2002068890 A * | 3/2002 |

OTHER PUBLICATIONS

Look, D.C., et al. "The Future of ZnO Light Emitters," Phys. Stat. Sol. (2004), pp. 1-10.

Pearton, S.J., et al. "Wide Band Gap Ferromagnetic Semiconductors and Oxides," Journal of Applied Physics vol. 93, No. 1, Jan. 1, 2003, pp. 1-13.

Web Page '99 SBIR Phase 1 . . . Topic 14—Electronic Materials, http://www-ee.eng.buffalo.edu/faculty/paololin/492/semicon.pdf, "Low-Temperature Hydrothermal Growth of Zno for Seminconductor Substrates," Feb. 26, 2004, 2 pages.

Web Page "Semiconductor Photonics", 3 pages.

Aulbur, W.; Density Functional Theory: Basic Ideas & Applications; Ohio State University.

Look, D.C., and Claflin, B.; P-type doping and devices based on ZnO; Aug. 2003; Wiley-VCH Verlag GmbH & Co.

Zunger, A.; Practical Doping Principles; NCPV and Solar Program Review Meeting 2003; pp. 831-835.

Zhang, S.B., Wei, S.H., and Zunger, A.; Intrinsic $n$-type versus $p$-type doping asymmetry and the defect physics of ZnO; Physical Review B; Jan. 31, 2001; pp. 075205-1-075205-7; vol. 63; The American Physical Society.

Limpijumnong, S., Zhang, S.B., Wei, S-H., and Park C.H; Doping by Large-Size-Mismatched Impurities: The Microscopic Origin of Arsenic- or Antimony-Doped $p$-Type Zinc Oxide; Physical Review Letters; Apr. 16, 2004; vol. 92, No. 15; The American Physical Society.

Yamamoto, T., and Katayama-Yoshida, H.; Solution Using a Codoping Method to *Unipolarity* for the Fabrication of $p$-Type ZnO; Japanese Journal of Applied Physics; Feb. 15, 1999; pp. L 166-L 169; vol. 38; Japanese Journal of Applied Physics Publication Board.

Park, C.H., Zhang, S.B., and Wei, S-H.; Origin of $p$-type doping difficulty in ZnO: The impurity perspective; Physical Review B; Aug. 5, 2002; pp. 073202-1-073202-3; vol. 66; The American Physical Society.

Tsukazaki, A., Atsushi, T., Ohtomo, A., Onuma, T., Ohtani, M., Makino, T., et al; Repeated temperature modulation epitaxy for p-type doping and light-emitting diode based on ZnO; Nature Materials; Jan. 2005; pp. 42-46; vol. 4; Nature Publishing Group.

Nonaka, M., Matsushima, S., Mizuno, M., and Kobayashi, K.; Electronic Structure of Group III Elements Dopes into ZnO by Using Molecular Orbital Calculation; Chemistry Letters 2002; Feb. 20, 2002; pp. 580-581; The Chemical Society of Japan.

Wang, L.G., and Zunger, A.; Cluster-Doping Approach for Wide-Gap Semiconductors: The Case of $p$-type ZnO; Physical Review Letters; Jun. 27, 2003; pp. 256401-1-256401-4; vol. 90, No. 25; The American Physical Society.

Norton, D.P., Heo, Y.W., Ivill, M.P., IP, K., Pearton, S.J., et al; ZnO: growth, doping and processing; Materialstoday; Jun. 2004; Elsevier Ltd.

Lee, E-C., Kim, Y.-S., Jin, Y.-G., and Chang, K.J.; First Principles Study of $p$-Type Doping and Codoping in ZnO; Journal of the Korean Physical Society; Dec. 2001; pp. S23-S26; vol. 39.

Morhain, C., Teisseire, M., Vezian, S., Vigue, F., Raymond, F., et al; Spectroscopy of Excitons, Bound Excitons and Impurities in h-ZnO Epilayers; Sep. 30, 2001; pp. 881-885; vol. 229, No. 2; Wiley VCH; Berlin.

Bandyopadhyay, S., Paul, G.K., Roy, R., Sen, S.K., and Sen, S; Study of structural and electrical properties of grain-boundary modified ZnO films prepared by sol-gel technique; Materials Chemistry and Physics; May 17, 2001; pp. 83-91; vol. 74; Elsevier Science B.V.

Wilkinson, J., Xion, G., Ucer, K.B., and Williams, R.T.; Lifetime and Oscillator Strength of Excitonic Luminescence in Zinc Oxide; Department of Physics, Wake Forest University, Winston-Salem, NC.

Kobayashi, A., Sankey, O.F., and Dow, J.D.; Deep energy levels of defects in the wurtzite semiconductors AlN, CdS, CdSe, and ZnO; Physical Review B; Jul. 15, 1983; pp. 946-956; vol. 28, No. 2; The American Physical Society.

Daneu, N., Reenik, A., and Bernik, S.; Grain Growth Control in $Sb_2O_3$-Doped Zinc Oxide; Journal of the American Ceramic Society; 2003; pp. 1379-1384; vol. 86, No. 8.

Ohyama, M.; Sol-Gel Preparation of Transparent and Conductive Aluminum-Doped Zinc Oxide Films with Highly Preferential Crystal Orientation; Journal of the American Ceramic Society; 1998; pp. 1622-1632; vol. 81, No. 6.

Duan, X.L., Yuan, D.R., Cheng, X.F., Sun, H.Q., Sun, Z.H., et al; Microstructure and Properties of $Co^{2+}$: $ZnAl_2O_4/SiO_2$ Nanocomposite Glasses Prepared by Sol-Gel Method; Journal of the American Ceramic Society; 2005; pp. 399-403; vol. 88, No. 2.

Sohn, K.S., Hwang, D.K., and Myoung, J.M.; Time Integrated/Resolved Photoluminescense of ZnO Films Deposited on Sapphire and GaAs; Japanese Journal of Applied Physics; Dec. 2003; pp. 7376-7378; The Japan Society of Applied Physics.

Sun, X.W.; Optical properties of epitaxially grown zinc oxide films on sapphire by pulsed laser deposition; Journal of Applied Physics; Jul. 1, 1999; pp. 408-411; vol. 86, No. 1; American Institute of Physics.

Burden, A.P., Bishop, H.E., Brierley, M., Friday, J.M., Hood, C., et al.; Incorporating consumer-priced field emitting inks into arrays of triode devices; Solid State Electronics; 2001; pp. 987-996; vol. 45; Printable Field Emitters Ltd.

Minami, T., Miyata, T., Shirai, T., and Nakatani, T.; Electroluminescent Oxide Phosphor Thin Films Prepared by a Sol-gel Process; Mat. Res. Soc. Symp. Proc.; 2000; pp. Q4.3.1-Q4.3.6; vol. 621; Materials Research Society.

Qiu, C., Chen, H., Wong, M., and Kwok, H.S.; Dependence of the Current and Power Efficiencies of Organic Light-Emitting Diode on the Thickness of the Constituent Organic Layers; IEEE Transactions On Electron Devices; Sep. 2001; pp. 2131-2137; vol. 48; IEEE.

Matsuda, T., Kawabe, M., Iwata, H., and Ohzone, T.; Visible Electroluminescence from MOS Capacitors with Si-Implanted $SiO_2$; IEICE Trans. Electron.; Sep. 11, 2002; pp. 1895-1904; vol. E85-C, No. 11.

Ong, H.C., Li, A.S.K., and Du, G.T.; Depth profiling of ZnO thin films by cathodoluminescence; Applied Physics Letters; Apr. 30, 2001; pp. 2667-2669; vol. 78, No. 18; American Institute of Physics.

Washington, P.L., Ong, H.C., Dai, J.Y., and Chang, R.P.H.; Determination of the optical constants of zinc oxide thin films by spectroscopic ellipsometry; Applied Physics Letter; Jun. 22, 1998; pp. 3261-3263; vol. 72, No. 25; American Institute of Physics.

Sekiguchi, T., Ohashi, N., and Yamane, H.; Cathodoluminescence Study on ZnO and GaN; Solid State Phenomenal 1998; pp. 171-182; vol. 63-64; Scitec Publications; Switzerland.

Kouyate, D., Ronfard-Haret, J.-C., and Kossanyi, J.; Photo- and electro- luminescence of rare earth-doped semiconducting zinc oxide electrodes: Emission from both the dopant and the support; Journal of Luminescence; 1991; pp. 205-210; vol. 50; Elsevier Science Publishers B.V.

Kossanyi, J., Kouyate, D., Pouliquen, J., Ronfard-Haret, J.C., Valat, P., et al.; Photoluminescence of Semiconducting Zinc Oxide Containing Rare Earth Ions as Impurities; Journal of Luminescence; 1990; pp. 17-24; vol. 46; Elsevier Science Publishers B.V. (north-Holland).

Wang, Y.G., Lau, S.P., Lee, H.W., Yu, S.F., Tay, B.K., et al.; Photoluminescence study of ZnO films prepared by thermal oxidation of Zn metallic films in air; Journal of Applied Physics; Jul. 1, 2003; pp. 354-358; vol. 94, No. 1; American Institute of Physics.

Yu, S.F., Yuen, C., Lau, S.P., Wang, Y.G., Lee, H.W., et al.; Ultraviolet amplifed spontaneous emission from zinc oxide ridge waveguides on silicon substrate; Applied Physics Letter; Nov. 24, 2003; 4288-4290; vol. 83, No. 21; American Institute of Physics.

Xiong, G., Wilkinson, J., Lyles, J., Ucer, K.B., and Williams, R.T.; Luminescence and stimulated emission in zinc oxide nanoparticles, films, and crystals.

Ong, H.C., Dai, J.Y., and Du, G.T.; Studies of electronic structure of ZnO grain boundary and its proximity by using spatially resolved electron energy loss spectroscopy; Applied Physics Letter; Jul. 8, 2002; pp. 277-279; vol. 81, No. 2; American Institute of Physics.

Agne, T., Guan, Z., Li, X.M., Wolf, H., and Wichert, T.; Incorporation of the Donor Indium in Nanocrystalline ZnO; phys. stat. sol.; 2002; pp. 819-823; vol. 229; WILEY-VCH Verlag Berlin GmbH; Berlin.

Qadri, S.B., Kim, H., Horwitz, J.S., and Chrisey, D.B.; Transparent conducting films of $ZnO-ZrO_2$: Structure and properties; Journal of Applied Physics; Dec. 1, 2000; pp. 6564-6566; vol. 88, No. 11; American Institute of Physics.

Han, J., Mantas, P.Q., and Senos, A.M.R.; Grain growth in Mn-Doped ZnO; Journal of the European Ceramic Society; 2000; 2753-2758; vol. 20.

Jin, Y., Zhang, B., Yang, S., Wang, Y., Chen, J., et al.; Room temperature UV emission of $Mg_xZn_{1-x}O$ films; Solid State Communications; 2001; pp. 409-413; vol. 119; Elsevier Science Ltd.

Petrik, N.G., Alexandrov, A.B., and Vall, A.I.; Interfacial Energy Transfer during Gamma Radiolysis of Water on the Surface of $ZrO_2$ and Some Other Oxides; J. Phys. Chem. B; 2001; pp. 5935-5944; vol. 105; American Chemical Society.

Counio, G., Esnouf, S., Gacoin, T., and Boilot, J.-P.; CdS:Mn Nanocrystals in Transparent Xerogel Matrices: Synthesis and Luminescence Properties; J. Phys. Chem.; 1996; pp. 20021-20026; vol. 100; American Chemical Society.

Stravrev, K., Kynev, K., St. Nickolov, G., and Dyakovitch, V.A.; Semiempirical Assignment of the Electron Transitions in Manganese(II)-Doped II-VI Compounds; J. Phys. Chem. Solids; 1987; pp. 841-844; vol. 48, No. 9; Pergamon Journals Ltd.

Falcony, C., Ortiz, A., Dominguez, J.M., Farias, M.H., Cota-Araiza, L. et al.; Luminescent Characteristics of Tb Doped $Al_2O_3$ Films Deposited by Spray Pyrolysis: J. Electrochem Soc.; Jan. 1992; pp. 267-271; vol. 139, No. 1; The Electrochemical Society, Inc.

Bachir, S., Kossanyi, J., Sandouly, C., Valat, P., and Ronfard-Haret, J.C.; Electroluminescence of $Dy^{3+}$ and $Sm^{3+}$ Ions in Polycrystalline Semiconducting Zinc Oxide; J. Phys. Chem; 1995; pp. 5674-5679; vol. 99; American Chemical Society.

Bachir, S., Kossanyi, J., and Ronfard-Haret, J.C.; Electroluminescence of $Ho^{3+}$ Ions in a ZnO Varistor-Type Structure; Solid State Communications; 1993; pp. 859-863; vol. 89, No. 10; Elsevier Science Ltd.; Great Britain.

Chakrabarti, S., Ganguli, D., Chaudhuri, S., and Pal, A.K.; Crystalline magnesium oxide films on soda lime glass by sol-gel processing; Meterials Letters; May 2002; pp. 120-123; vol. 54; Elsevier Science B.V.

Arkles, B.; Commercial Applications of Sol-Gel-Derived Hybrid Materials; MRS Bulletin; May 2001; pp. 402-407.

Murray, C.E., Noyan, I.C., and Mooney, P.M.; Mapping of strain fields about thin film structures using x-ray microdiffraction; Applied Physics Letters; Nov. 17, 2003; pp. 4163-4165; vol. 83, No. 20; American Institute of Physics.

Modena, S., Soraru, G.D., Blum, Y., and Raj, R.; Passive Oxidation of an Effluent System: The Case of Polymer-Derived SiCO; Journal of the American Ceramic Society; 2005; pp. 339-345; vol. 88.

Noyan, I.C., Wang, P.-C., Kaldor, S.K., and Jordan-Sweet, J.L.; Deformation field in single-crystal fields semiconductor substrates caused by metallization features; Applied Physics Letters; Apr. 19, 1999; pp. 2352-2354; vol. 74, No. 16; American Institute of Physics.

Noyan, I.C., Jordan-Sweet, J., Liniger, E.G., and Kaldor, S.K.; Characterization of substrate-thin-film interfaces with x-ray microdiffraction; Applied Physics Letters; Jun. 22, 1998; pp. 3338-3340; vol. 72, No. 25; American Institute of Physics.

Tuller, H.L.; ZnO Grain Boundaries: Electrical Activity and Diffusion; Journal of Electroceramics; 1999; pp. 33-40; vol. 4:S1; Kluwer Academic Publishers; Boston.

Westin, G., Ekstrand, A., Nygren, N., Osterlund, R., and Merkelbach, P.; Preparation of ZnO-based Varistors y the Sol-Gel Technique; J. Mater. Chem.; 1994; pp. 615-621; vol. 4.

Wang, M., Yang, X., and Wang., F.; Properties of Sensitive Materials Mainly Composed of ZnO; J. Mater. Sci. Technol.; 2000; p. 204; vol. 16, No. 2.

Baptista, J.L., and Mantas, P.Q.; High Temperature Characterization of Electrical Barriers in ZnO Varistors; Journal of Electroceramics; 2000; pp. 215-224; vol. 4:1; Kluwer Academic Publishers; The Netherlands.

Brankovic, Z., Brankovic, G., Poleti, D., and Varela, J.A.; Structural and electrical properties of ZnO varistors containing different spinel phases; Ceramics International; 2001; pp. 115-122; vol. 27; Elsevier Science Ltd. And Techna S.r.l.

Tanaka, A., and Mukae, K.; Evaluation of Single Grain Boundaries in ZnO: Rare-Earth Varistor by Micro-Electrodes; Key Engineering Materials; 1999; pp. 235-240; vols. 157-158; Trans Tech Publications, Switzerland; CSJ Series-Publications of the Ceramic Society of Japan vol. 1, The Ceramic Society of Japan.

Pandey R., Jaffe, J.E., and Kunz, A.B., Ab initio band-structure calculations by alkaline-earth oxides and sulfides; Physical Review B; Apr. 15, 1991; pp. 9228-9237; vol. 43, No. 11; The American Physical Society.

Canney, S.A., Sashin, V.A., Ford, M.J., and Kheifets, A.S.; Electronic band structure of magnesium and magnesium oxide: experiment and theory; J. Phys. Condens. Matter; 1999; pp. 7507-7522; vol. 11; IOP Publishing Ltd.

Yamasaki, A., and Fujiwara, T.; Electronic structure of the MO oxides (M=Mg, Ca, Ti, V) in the GW approximation; Physical Review B; 2002; pp. 245108-1-245108-9; vol. 66; The American Physical Society.

Mikajlo, E.A., Sashin, V.A., Nixon, K.L., Seoule De Bas, B., Dorsett, H.E., and Ford, M.J.; Band Structures of the Group I and II Oxides: Using EMS Measurements as a Test of Theoretical Models.

Johnson, P.D.; Some Optical Properties of MgO in the Vacuum Ultraviolet; Physical Review; May 15, 1954; pp. 845-846; vol. 94, No. 4.

Narazaki, A., Tanaka, K., Hirao, K., Hashimoto, T., Nasu, H., et al.; IR and XPS Studies on the Surface Structure of Poled $ZnO-TeO_2$ Glasses with Second-Order Nonlinearity; Journal of the American Ceramic Society; 2001; pp. 214-217; vol. 84.

Schonberger, U., and Aryasetiawan, F.; Bulk and surface electronic structures of MgO; Physical Review B; Sep. 15, 1995; pp. 8788-8793; vol. 52, No. 12; The American Physical Society.

Gonzalez, R., Chen, Y., Sebek, R.M., Williams, G.P., Williams, R.T., et al.; Properties of the 800-nm luminescence band in neutron-irradiated magnesium oxide crystals; Physical Review B; Mar. 1, 1991; pp. 5228-5233; vol. 43, No. 7; The American Physical Society.

Balzer, B., Hagemeister, M., Kocher, P., and Ludwig, J.G.; Mechanical Strength and Microstructure of Zinc Oxide Varistor Ceramics; Journal of the American Ceramic Society; 2004; pp. 1932-1938; vol. 87.

Sheng, H., Emanetoglu, N.W., Muthukumar, S., Yakshinskiy, B.V., Feng, S., et al., Ta/Au Ohmic Contacts to n_type ZnO; Journal of Electronic Materials; 2003; p. 935; vol. 32, No. 9.

Sheng, H., Emanetoglu, N.W., Muthukumar, S., Feng, S., and Lu, L.; Nonalloyed Al Ohmic Contacts to $Mg_xZn_{12x}O$; Journal of Electronic Materials; 2002; p. 811; vol. 31, No. 7.

Xiong, G., Wilkinson, J., Mischuck, B., Tu Zemen, S., Ucer, K.B., et al; Control of p- and n-type conductivity in sputter deposition of undoped ZnO; Applied Physics Letters; Feb. 18, 2002; p. 1195; vol. 80, No. 7.

Yamamoto, T., and Katayama-Yoshida, H.; Unipolarity of ZnO with a wide-band gap and its solution using codoping method; Journal of Crystal Growth; 2000; pp. 552-555; vol. 214/215; Elsevier Science B.V.

Chang, R., Marks, T., Mason, T., and Poeppelmeir, K.; *n/p*-Type Transparent Conductors; pp. 259-260.

Olorunyolemi, T., Birnboim, A., Carmel, Y., Wilson, O.C., Lloyd, I.K.; Thermal Conductivity of Zinc Oxide: From Green to Sintered State; Journal of the American Ceramic Society; 2002; pp. 1249-1253; vol. 85.

Martin, L.P., and Rosen, M.; Correlation between Surface Area Reduction and Ultrasonic Velocity in Sintered Zinc Oxide Powders; Journal of the American Ceramic Society; 1997; pp. 839-846; vol. 80.

Wilkinson, J., Xiong, G., Ucer, K.B., and Williams, R.T.; Lifetime and Oscillator Strength of Excitonic Luminescence in Zinc Oxide.

Sekiguchi, T., Haga, K., and Inaba, K.; ZnO films grown under the oxygen-rich condition; Journal of Crystal Growth; 2000; pp. 68-71; vol. 214-215; Elsevier Science B.V.

Van De Walle, C.G.; Hydrogen as a Cause of Doping in Zinc Oxide; Physical Review Letters; Jul. 31, 2000; pp. 1012-1015; vol. 85, No. 5; The American Physical Society.

Kato, H., Sano, M., Miyamoto, K., and Yao, T.; Effect of O/Zn on Flux Ration on Crystalline Quality of ZnO Films Grown by Plasma-Assisted Molecular Beam Epitaxy; Japanese Journal of Applied Physics; 2003; pp. 2241-2244; vol. 42; The Japan Society of Applied Physics.

Nakahara, K., Tanabe, T., Takasu, H., Fons, P., Iwata, K., et al.; Growth of undoped ZnO Films with Improved Electrical Properties by Radical Source Molecular Beam Epitaxy; Japanese Journal of Applied Physics; 2001; pp. 250-254; vol. 40; The Japan Society of Applied Physics.

Wang, X., Du, G., Gu, C., Jia, J., Li, X., et al.; Two-step growth of ZnO thin films on diamond/Si low-pressure metal-organic chemical vapour deposition; J. Phys. D: Appl. Phys.; 2002; pp. L74-L76; vol. 35; IOP Publishing Ltd., United Kingdom.

Han, J., Mantas, P.Q., and Senos, A.M.R.; Grain growth in Mn-doped ZnO; Journal of the European Seramic Society; 2000; pp. 2753-2758; vol. 20; Elsevier Science Ltd.

Fons, P., Iwata, K., Niki, S., Yamada, A., Matsubara, K., et al.; Uniaxial locked growth of high-quality epitaxial ZnO films on (1 1 2 0)α-$Al_2O_3$; Journal of Crystal Growth; 2000; pp. 532-536; vol. 209; Elsevier Science B.V.

Haga, K., Kamidaira, M., Kashiwaba, Y., Sekiguchi, T., Watanabe, H.; ZnO thin films prepared by remote plasma-enhanced CVD method; Journal of Crystal Growth; 2000; pp. 77-80; vol. 214/215; Elsevier Science B.V.

Fons, P., Iwata, K., Niki, S., Yamada, A., and Matsubara, K.; Growth of high-quality epitaxial ZnO films on α-$Al_2O_3$; Journal of Crystal Growth; 1999; pp. 627-632; vol. 201/202; Elsevier Science B.V.

Myoung, J.-M., Yoon, W-H., Lee, D-H., Yun, I., Bae, S-H., et al.; Effects of Thickness Variation of Properties of ZnO Thin Films Grown by Pulsed Laser Deposition; Japanese Journal of Applied Physics; 2002; pp. 28-31; vol. 41; The Japan Society of Applied Physics.

Yuldashev, S.U., Panin, G.N., Choi, S.W., Yalishev, V.S., Nosova, L.A., et al.; Electrical and Optical Properties of ZnO Films Grown on GaAs Substrates; Jpn. J. Appl. Phys; 2003; pp. 3333-3336; vol. 42; The Japan Society of Applied Physics.

Nonaka, M., Matsushima, S., Mizuno, M., Kobayashi, K.; Electronic Structure of Group III Elements Doped into ZnO by Using Molecular Orbital Calculation; Chemistry Letters; 2002; pp. 580-581; The Chemical Society of Japan.

Lin, G-R., and Wang, S-C.; Comparison of High-Resistivity ZnO Films Sputtered on Different Substrates; Japanese Journal of Applied Physics; 2002; pp. L398-L401; vol. 41; The Japan Society of Applied Physics.

Mantas, P.Q., and Baptista, J.L.; The Barrier Height Formation in ZnO Varistors; Journal of the European Ceramic Society; 1995; pp. 605-615; vol. 15; Elsevier Science Limited, Great Britain.

Albertsson, J., and Abrahams, S.C.; Atomic Displacement, Anharmonic Thermal Vibration, Expansivity and Pyroelectric Coefficient Thermal Dependences in ZnO; Acta Cryst.; 1989; pp. 34-40; vol. B45; International Union of Crystallography.

Blevins, J.D.; Wide Bandgap Semiconductor Substrates: Current Status and Future Trends.

Teke, A., Ozgur, U., Dogan, S., Gu, X., Morkoc, H., et al.; Excitonic fine structure and recombination dynamics in single-crystalline ZnO; Physical Review B; 2004; pp. 195207-1-195207-10; vol. 70; The American Physical Society.

Look, D.C., Reynolds, D., Litton, C.W., Jones, R.L., Eason, D.B., et al.; Characterization of homoepitaxial *p*-type ZnO grown by molecular beam epitaxy; Applied Physics Letters; Sep. 2, 2002; pp. 1830-1832; vol. 81, No. 10; American Institute of Physics.

Kim, K-K., Kim, H-S., Hwang, D-K., Lim, J-H., and Park, S-J.; Realization of *p*-type ZnO thin films via phosphorus doping and thermal activation of the dopant; Applied Physics Letters; Jul. 7, 2003; pp. 63-65; vol. 83, No. 1; American Institute of Physics.

Look, D.C.; Emerging Research Fonts Comments by David C. Look; ISI Essential Science Indicators; Apr. 28, 2005.

Senger, R.T., and Bajai, K.K.; Binding energies of excitons in polar quantum well heterostructures; Physical Review B; 2003; pp. 205314-1-205314-9; vol. 68; The American Physical Society.

Subramanyam, T.K., Naidu, B., and Uthanna, S.; Structure and Optical Properties of dc Reactive Magnetron Sputtered Zinc Oxide Films; Cryst. Res. Technol.; 1999; pp. 981-988; vol. 34.

Muth, J.F., Brown, J.D., Johnson, M.A.L., Yu, Z., Kolbas, R.M., et al.; Absorption coefficient and refractive index of GaN, AlN and AlGaN alloys; 1999; MRS Internet J. Nitride Semicond.

Yoshikawa, H., and Adachi, S.; Optical Constants of ZnO; Japanese Journal of Applied Physics; 1997; pp. 6237-6243; vol. 36.

Springer, J., Poruba, A., Vanecek, M., Fay, S., Feitknecht, L., et al.; Improved optical model for thin film silicon solar cells; Presented at 17th European Photovoltaic Solar Energy Conference, Munich 2001.

Neethling, J.H., Scriven, G.J., and Krekels, T.; A TEM investigation of $Zn_3As_2$ grown on (001) and (111) InP by MOVPE; Journal of Materials Science; 2001; pp. 3997-4002; vol. 36; Kluwer Academic Publishers.

Brink, D.J., and Engelbrecht, A.A.; Ellipsometric investigation of rough zinc arsenide epilayers; Applied Optics; Apr. 1, 2002; pp. 1894-1898; vol. 41, No. 10; Optical Society of America.

Scriven, G.J., Leitch, A.W.R., Neethling, J.H., Kozyrkov, V.V., and Watters, V.J.; The growth of $Zn_3As_2$ on InP by atmospheric pressure MOVPE; Journal of Crystal Growth; 1997; pp. 813-816; vol. 170; Elsevier Science B.V.

Engelbrecht, J.A.A., Scriven, G.J., Neethling, J.H., and Wagener, M.C.; Crack formation in $Zn_3As_2$ epilayers grown by MOVPE; Journal of Crystal Growth; 2000; pp. 235-244; vol. 216; Elsevier Science B.V.

Norman, A.G., Olson, J.M., Romero, M.J., and Al-Jassim, M.M.; Electron Microscopy Studies of Potential 1-eV Bandgap Semiconductor Compounds $AnGeAs_2$ and $Zn_3As_2$ Grown by MOVPE; National Renewable Energy Laboratoy.

Miles, G.C., and West, A.R.; Polymorphism and Thermodynamic Stability of $Zn_7Ab_2O_{12}$; Journal of the American Ceramic Society; 2005; pp. 396-398; vol. 88.

Tomlins, G.W., Routbort, J.L., and Mason, T.O.; Oxygen Diffusion in Single-Crystal Zinc Oxide; Journal of the American Ceramic Society; 1998; pp. 869-876; vol. 81.

Botha, J.R., Scriven, G.J., Engelbrecht, J.A.A., and Leitch, A.W.R.; Photoluminescence properties of metalorganic vapor phase epitaxial $Zn_3As_2$; Journal of Applied Physics; Nov. 15, 1999; pp. 5614-5618; vol. 86, No. 10; American Institute of Physics.

Xiong, G., Wilkinson, J., Mischuck, B., Tuzemen, S., Ucer, K.B., et al., Control of *p*-and *n*-type conductivity in sputter deposition of undoped ZnO; Applied Physics Letters; Feb. 18, 2002; pp. 1195-1197; vol. 80, No. 7; American Institute of Physics.

Look, D.C., Renlund, G.M., Burgener, II, R.H., and Sizelove, J.R.; As-doped p-type ZnO produced by an evaporation/sputtering process; Applied Physics Letters; Nov. 2004; vol. 85.

Aoki, T., Shimizu, Y., Miyake, A., Nakamura, A., Nakanishi, Y., and Hatanaka, Y.; p-Type ZnO Layer Formation by Excimer Laser Doping; phys. stat. sol.; 2002; pp. 911-914; vol. 229, No. 2; WILEY-VCh Verlag Berlin GmbH, Berlin.

Lee, J-M., Kim, K.K., Park, S-J., and Choi, W.K.; Low-resistance and non-alloyed ohmic contacts to plasma treated ZnO; Applied Physics Letters; Jun. 11, 2001; pp. 3842-2844; vol. 78, No. 24; American Institute of Physics.

Yamamoto, T.; Codoping Method to Realize Low-Resistivity *p*-type ZnO Thin Films; Asia Display/IDW '01, Oct. 16-19, 2001, Nagoya, Oct. 18, PH1-2.

Wang, L.G., and Zunger, A.; Cluster-Doping Approach for Wide-Gap Semiconductors: The Case of *p*-type ZnO; Physical Review Letters; Jun. 27, 2003; pp. 256401-1-256401-4; vol. 90, No. 25; The American Physical Society.

Nakahara, K., Takasu, H., Fons, P., Yamada, A., Iwata, K., et al.; Growth of N-doped and Ga+N-codoped ZnO films by radical source molecular beam epitaxy; Journal of Crystal Growth; 2002; pp. 503-508; vol. 237-239; Elsevier Science B.V.

Recnik, A., Daneu, N., Walther, T., and Mader, W.; Structure and Chemistry of Basal-Plane Inversion Boundaries in Antimony Oxide-Doped Zinc Oxide; Journal of the American Ceramic Society; 2001; pp. 2357-2668; vol. 84.

Ryu, Y.R., Kim, W.J., and White, H.W.; Fabrication of homostructural ZnO p-n junctions; Journal of Crystal Growth; 2000; pp. 419-422; vol. 219; Elsevier Science B.V.

Lu, J., Ye, Z., Wang, L., Huang, J., and Zhao, B.; Structural, electrical and optical properties of N-doped ZnO films synthesized by SS-CVD; Materials Science in Semiconductor Processing; 2003; pp. 491-496; vol. 5; Elsevier Science Ltd.

Zhenguo, J., Kun, L., Chengxing, Y., Ruixin, F., and Zhizhen, Y.; Structural, optical and electrical properties of ZnO thin films prepared by reactive deposition; Journal of Crystal Growth; 2003; pp. 246-251; vol. 253; Elsevier Science B.V.

Ji, Z., Yang, C., Liu, K., and Ye, Z.; Fabrication and characterization of p-type ZnO films by pyrolysis of zinc-acetate—ammonia solution; Journal of Crystal Growth; 2003; pp. 239-242; vol. 253; Elsevier Science B.V.

Ye, Z-Z., Lu, J-G., Chen, H-H., Zhang, Y-Z., Wang, L., et al.; Preparation and characteristics of p-type ZnO films by DC reactive magnetron sputtering; Journal of Crystal Growth; 2003; pp. 258-264; vol. 253; Elsevier Science B.V.

Minegishi, K., Koiwai, Y., Kikuchi, Y., Yano, K., Kasuga, M., et al.; Growth of p-type Zinc Oxide Films by Chemical Vapor Deposition; Japanese Journal of Applied Physics; 1997; pp. L 1453-L 1455; vol. 36.

Joseph, M., Tabata, H., and Kawai, T.; p-Type Electrical Conduction in ZnO Thin Films by Ga and N Codoping; Japanese Journal of Applied Physics; 1999; pp. L 1205-L 1207; vol. 38; Publication Board, Japanese Journal of Applied Physics.

Ashrafi, A.B.M.A., Suemune, I., Kumano, H., and Tanaka, S.; Nitrogen-Doped p-Type ZnO Layers Prepared with $H_2O$ Vapor-Assisted Metalorganic Molecular-Beam Epitaxy; Japanese Journal of Applied Physics; 2002; pp. L 1281-L 1284; vol. 41; The Japan Society of Applied Physics.

The Promise of Solid State Lighting for General Illumination: Light Emitting Diodes (LEDs) and Organic Light Emitting Diodes (OLEDs); 2001; pp. 1-29; Optoelectronics Industry Development Association, Washington, D.C.

Talbot, D.; LEDs vs. the Light Bulb; Technology Review; May 2003; pp. 30-36.

Johnson, S.; LEDs—An Overview of the State of the Art in Technology and Application; Light Right 5 Conference, May 27-31, 2002, Nice, France.

Tuzemen, S., Xiong, G., Wilkinson, J., Mischick, B., Ucer, K.B., et al.; Production and properties of p-n junctions in reactively sputtererd ZnO; Physica B; 2001; pp. 1197-1200; vol. 308-310; Elsevier Science B.V.

Guo, X-L., Choi, J-H., Tabata, H., and Kawai, T.; Fabrication and Optoelectronic Properties of a Transparent ZnO Homostructural Light-Emitting Diode; Japanese Journal of Applied Physics; 2001; pp. L 177-L 180; vol. 40; The Japan Society of Applied Physics.

Jadwisienczak, W.M., Lozykowski, H.J., Xu, A., and Patel, B.; Visible Emission from ZnO Doped with Rare-Earth Ions; Journal of Electronic Materials; 2002; pp. 776-784; vol. 31.

Xiong, G., Wilkinson, J., Tuzemen, S., Ucer, K.B., and Williams, R.T.; Toward a new ultraviolet diode laser: luminescence and p-n junctions in ZnO films.

Hoffman, R.L., Norris, B.J., and Wager, J.F.; ZnO-based transparent thin-film transistors; Applied Physics Letters; Feb. 3, 2003; pp. 733-735; vol. 82, No. 5; American Institute of Physics.

Bockowshi, M.; Growth and Doping of GaN and AlN Single Crystals under High Nitrogen Pressure; Cryst. Res. Technol.; 2001; pp. 771-787; vol. 36; WILEY-VCH Verlag Berlin GmbH, Berlin.

Katayama-Yoshida, H., Sato, K., and Yamamoto, T.; Materials design for new functional semiconductors by *ab initio* electronic structure calculation: Prediction vs. experiment; JSAP International; Jul. 2006; pp. 20-27; No. 6.

Mukai, T., Morita, D., and Nakamura, S.; High-power UV InGaN/AlGaN double-heterostructure LEDs; Journal of Crystal Growth; 1998; pp. 778-781; vol. 189/109; Elsevier Science B.V.

Xing, H., Green, D.S., McCarthy, L., Smorchkova, I.P., Chavarkar, P., et al.; Progress in Gallium Nitride-based Bipolar Transistors.

Piprek, J., and Nakamura, S.; nano-Scale Effects in GaN-based Light-Emitting Diodes; 2004.

Piprek, J.; Simulation of GaN-based Light-Emitting Devices; 2004.

Bunea, G.E., Herzog, W.D., Unlu, M.S., Goldberg, B.B., and Molnar, R.J.; Time-resolved photoluminescence studies of free and donor-bound exciton in GaN grown by hydride vapor phase epitaxy.

Yao, T.; Plasma-Assisted MBE Growth of ZnO; Molecular Beam Epitaxy; pp. 98-105.

Chapter 2 Geometric Structure of Metal Oxides; pp. 55-58.

Chapter 4 Electronic Structure of Non-Transition-Metal-Oxide Surfaces; pp. 143-150.

Ip, K., Khanna, R., Norton, D.P., Pearton, S.J., Ren, F., et al.; Thermal Stability of Tungsten-Based Schottky Contacts to N-Type ZnO.

* cited by examiner

ZINC OXIDE CRYSTAL GROWTH SUBSTRATE

CROSS-REFERENCE TO RELATED APPLICATIONS

This application claims the benefit of U.S. Provisional Application No. 60/471,916, filed May 20, 2003, U.S. Provisional Application No. 60/488,677, filed Jul. 18, 2003, and U.S. Provisional Application No. 60/560,427, filed Apr. 8, 2004, which applications are incorporated by reference.

BACKGROUND OF THE INVENTION

The present invention provides zinc oxide crystal growth substrates.

Zinc oxide (ZnO) is a wide band gap semiconductor with potential for use in electrically excited devices such as light emitting devices (LEDs), laser diodes (LDs), field effect transistors (FETs), photodetectors operating in the ultraviolet and at blue wavelengths of the visible spectrum, and other similar devices. Currently gallium nitride (GaN), heteroepitaxially deposited on a single crystal substrate such as sapphire or silicon carbide, is used in radiation detecting and light emitting devices for these purposes.

Some characteristic parameters of GaN and the substrates used for its growth are shown in Table 1.

TABLE 1

| Crystal | Lattice Type | Lattice Parameters [nm] | Thermal Expansion Coefficient $[10^6/K]$ |
| --- | --- | --- | --- |
| GaN | hexagonal (wurtzite) | a = 0.3189 | 5.59 |
|  |  | c = 0.5185 | 3.17 |
| Alpha-$Al_2O_3$ | hexagonal (wurtzite) | a = 0.4758 | 7.5 |
|  |  | c = 1.2991 | 8.5 |
| 6H—SiC | hexagonal (sphalerite) | a = 0.3081 | 4.2 |
|  |  | c = 1.511 | 4.68 |
| $NdGaO_3$ | Orthorhombic | a = 0.5422 | 11.9 |
|  |  | b = 0.5499 | 6.6 |
|  |  | c = 0.7708 | 5.8 |
| YSZ | Cubic (fluorite) | a = 0.515 | 11.4 |
| Si | Cubic silicon | a = 0.3431 | 2.44 |
| ZnO | hexagonal (wurtzite) | a = 0.3252 | 2.9 |
|  |  | c = 0.5213 | 4.75 |

Due to differences in crystal lattice parameters and coefficient of thermal expansion, a high density of crystal lattice dislocations is often introduced into the GaN crystal. This introduces a large lattice strain, which may create a nucleation site that may propagate lattice defects into the growing layer, and ultimately degrade the optical properties of the GaN and result in inferior device performance. A buffer layer may be placed between the GaN and the substrate, but it does not eliminate the defect migration into the active layer during crystal growth. Moreover, the buffer layer is generally deposited on a conventional self supporting crystal growth substrate such as sapphire ($Al_2O_3$) or SiC. The sapphire and silicon carbide substrates are relatively expensive. It would be an advancement in the art to provide a low cost alternative substrate for GaN crystal growth, or other active crystals.

From Table 1, ZnO is a good substrate for the crystal growth of GaN. Zinc oxide has been grown as a single crystal boule, sliced into thin wafer self supporting substrate, and used as a crystal growth substrate. This is a complicated and expensive process. It would be an advancement in the art to provide an efficient and economical method of preparing a ZnO crystal growth substrate.

BRIEF SUMMARY OF THE INVENTION

The present invention is drawn to a single crystal zinc oxide crystal growth substrate. A thin layer of single crystal zinc oxide is deposited on a self supporting substrate surface. The zinc oxide has a crystal lattice which permits the crystal growth of a crystal compatible with zinc oxide.

The self supporting substrate includes crystalline, polycrystalline, and amorphous substrates. Conventional crystal growth substrates, such as sapphire and silicon carbide may be used. But the present invention may advantageously be used with lower cost substrates including, but not limited to, amorphous fused silica ($SiO_2$), polycrystalline alumina, and crystalline silicon wafer.

Crystals compatible with zinc oxide will typically have a lattice parameter within about 5% of a corresponding lattice parameter of the zinc oxide. Examples of possible compatible crystals include, but are not limited to, AlN, SiC, and GaN, as well as n-type and p-type zinc oxide. The thin layer of zinc oxide may optionally be doped with n-type or p-type dopants.

The thin layer of single crystal zinc oxide is deposited on the self supporting substrate surface by a chemical deposition process, which may include, but is not limited to, RF sputtering, CVD (chemical vapor deposition), MOCVD (metal organic chemical vapor deposition), spin coating, electrophoresis, and hydrothermal growth processes. The thickness of the zinc oxide layer may vary depending on the desired application. In many applications, the thickness will be less than about 5 μm. However, in some applications the thickness may be greater than about 5 μm. Deposition processes may be repeated as needed to build up a desired thickness.

BRIEF DESCRIPTION OF THE SEVERAL VIEWS OF THE DRAWINGS

A more particular description of the invention briefly described above will be rendered by reference to specific embodiments thereof which are illustrated in the appended drawings. These drawings depict only typical embodiments of the invention and are not therefore to be considered to be limiting of its scope. The invention will be described and explained with additional specificity and detail through the use of the accompanying drawings in which.

DETAILED DESCRIPTION OF THE INVENTION

Figure 1:
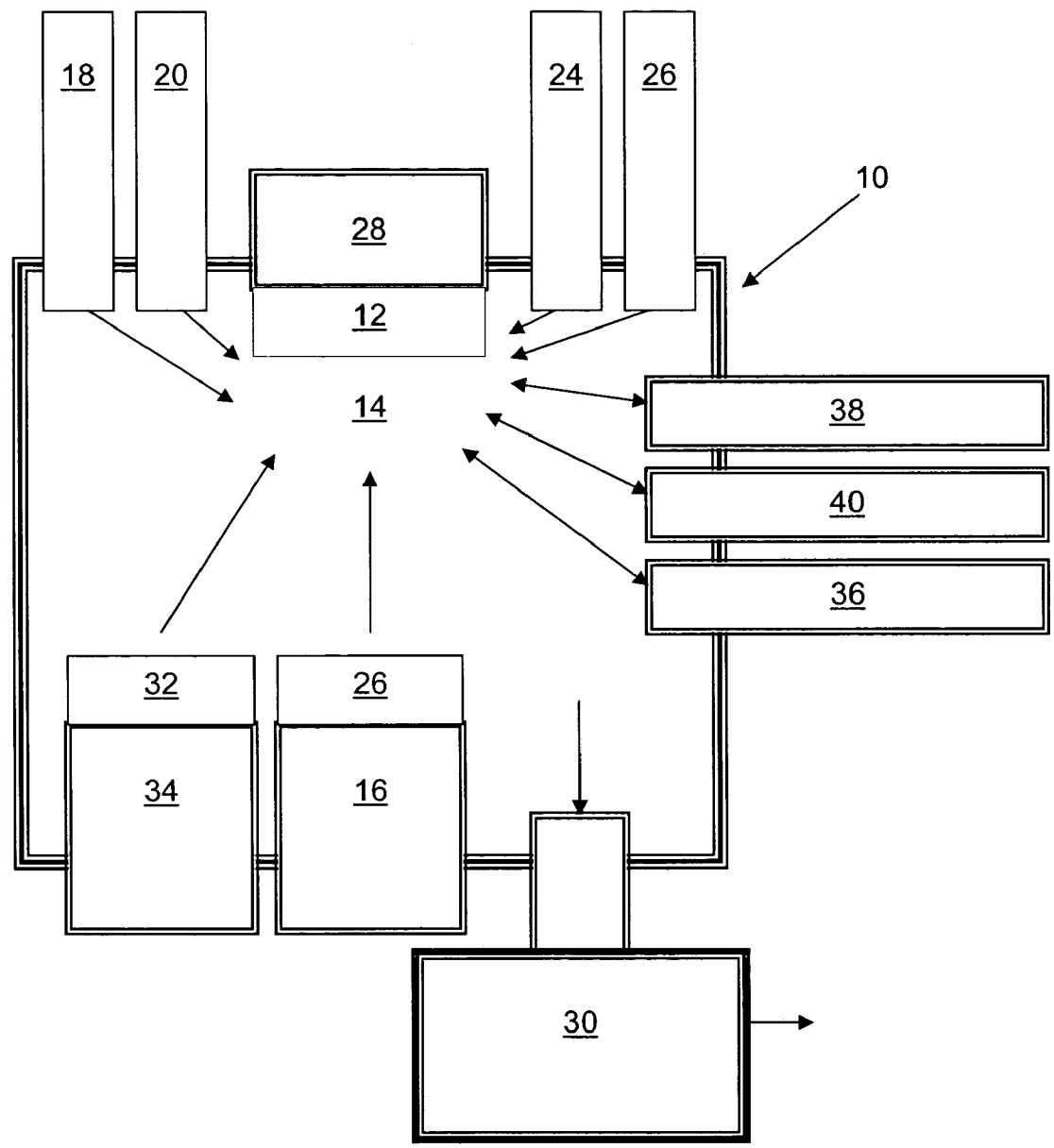
FIG. 1 is a schematic representation of a sputtering system used in the fabrication of certain zinc oxide crystal growth substrates.

The present invention is drawn to a zinc oxide crystal growth substrate. The zinc oxide crystal growth substrate includes a thin layer of single crystal zinc oxide deposited on an self supporting substrate surface by a chemical deposition process. The self supporting substrate may be amorphous, polycrystalline, or crystalline. As used herein, single crystal zinc oxide includes zinc oxide with a single predominant reflection on an X-ray diffraction pattern. Polycrystalline zinc oxide will possess multiple reflection peaks on an X-ray diffraction pattern. Persons skilled in the art will appreciate that a perfect single crystal, defect free, does not exist. There will always be some minor crystal defects present. As used herein, a single predominant reflection peak will possess at least 95% of the integrated area of the X-ray diffraction pattern, and more preferably greater than 99%.

From X-ray diffraction data, the single crystal zinc oxide may be oriented in the (002) plane. The zinc oxide may be oriented in other crystal planes depending on the crystal orientation of the self supporting substrate. For example, if (111) silicon or (111) sapphire is used as the self-supporting substrate, then (111) ZnO may be prepared.

The thin layer of zinc oxide has a crystal lattice which permits the crystal growth of a crystal compatible with zinc oxide. The compatible crystal preferably has a lattice parameter within about 5% of a corresponding lattice parameter of the zinc oxide. However, several compatible crystals are shown in Table 1, some of which have lattice parameter mismatches that exceed 5%. By closely matching the lattice parameters of the substrate and the crystal grown thereon, the resulting crystal may have fewer lattice defects transferred from the growth substrate into the grown crystal.

The self supporting substrate may be a low-cost substrate, including but not limited to, amorphous fused silica ($SiO_2$), polycrystalline alumina, or crystalline silicon wafer. The amorphous substrate may also include an amorphous $SiO_2$ coating on silicon wafer which may be a native oxide layer or a grown oxide layer. The self supporting substrate may include commonly used crystalline substrate materials, including but not limited to, silicon carbide and sapphire.

It is unexpected that fused silica may be used successfully as a self supporting substrate for single crystal zinc oxide. Amorphous fused silica possesses bond angles that can change readily and sustain strain. In contrast, some common crystalline substrate materials cannot support the strain created by different crystals grown thereon.

The compatible crystal may include, but is not limited to GaN, AlN, SiC, and ZnO. GaN, AlN, SiC, and ZnO may be useful for the fabrication semiconductor electronic devices, discussed above. AlN and SiC may also be useful used as a thermal management substrate because of their high thermal conductivity. In addition, because AlN and pure, grown SiC have high resistivity, AlN and SiC may replace BeO (beryllia) in microelectronics thermal management applications. For thermal management applications, the zinc oxide substrate does not need to be n-type or p-type doped. It is important that the substrate be a single crystal with a lattice that closely matches the crystal grown thereon.

Single crystal zinc oxide exhibits intrinsic n-type conduction due to the presence of excess donors. However, the electrical properties of the zinc oxide may be modified during deposition by incorporating either a p-type dopant or an n-type dopant. Zinc oxide based semiconductor devices containing a p-n junction may be readily fabricated utilizing a zinc oxide substrate within the scope of the present invention. The n-type zinc oxide may contain an n-type dopant selected from known dopant materials. Typical n-type dopants include, but are not limited to, ions of Al, Ga, B, H, Yb and other rare earth elements, Y, Sc, and mixtures thereof. The p-type zinc oxide may contain a p-type dopant selected from known p-type dopant materials. Typical p-type dopants include, but are not limited to, nitrogen, phosphorus, arsenic, antimony, bismuth, copper, chalcogenides of the foregoing, and mixtures thereof.

The chemical deposition process is preferably a commercially viable process including, but not limited to RF sputtering, CVD (chemical vapor deposition), MOCVD (metal organic chemical vapor deposition), spin coating, electrophoresis, and hydrothermal growth processes. Such processes may be used to deposit a thin layer of zinc oxide having a thickness less than about 5 µm. Thicker layers may be built up by repeating the deposition process.

In one embodiment within the scope of the invention, the chemical deposition process included RF sputtering using an RF sputtering system having a zinc metal target, a substrate surface, and a plasma comprising oxygen and an inert sputtering gas. The RF sputtering system operated at conditions which produced the thin layer of single crystal zinc oxide on the substrate surface.

In the RF magnetron sputtering process, a substrate is placed in a low-pressure chamber. The magnetron sputtering head is driven by an RF power source which generates a plasma and ionization of the gas or gases (e.g., argon and selected dopants). For RF sputtering, a high-frequency generator is used generating electromagnetic power in the MHz-Region (typically about 13.56 MHz). Argon ions bombard the target releasing ions from the target which are liberated and accelerated towards the substrate. Additional atoms in the plasma may also be deposited onto the substrate.

The system may operate at a power in the range from about 20 to about 120 watts. Persons skilled in the art will appreciate that the power may be varied to control deposition time and film thickness, as well as the quality of the resulting film.

Good results have been obtained when the inert sputtering gas is present in the sputtering atmosphere at a pressure in the range from about 4 to 20 mtorr. The inert sputtering gas is preferably selected from argon, krypton, xenon, neon, and helium. Argon is a presently preferred inert sputtering gas. Small amounts of oxygen may be included in the sputtering gas, usually at a pressure in the range from about 1 to 4 mtorr. In some embodiments, beneficial results have been obtained when the thin film is annealed at a temperature in the range from about 300 to about 430° C. for a time period in the range from about 1 to about 15 minutes.

A combination of sputtering and thermal evaporation may also be used to deposit the zinc oxide more quickly.

Spin coating is another useful process for depositing the thin film of zinc oxide. An organic molecule containing zinc, such as zinc 2–4 pentanedionate is used as the zinc source. A solution of this compound dissolved in a suitable solvent, such as butanol, is spun onto the substrate, such as fused silica. After a layer is spun on the substrate, it is heated to about 600° C. for about 10 minutes for pyrolysis of the organics. This procedure is repeated 5 or 6 times to get the desired film thickness. The substrate is annealed at about 700° C. for 1 to 5 hours in a nitrogen atmosphere. The required oxygen can come from the atmosphere or can come from being part of the organic precursors.

A single crystal zinc oxide crystal growth substrate may be prepared by metal organic chemical vapor deposition (MOCVD). MOCVD is a modified chemical vapor deposition process that works similar to the spin coating processes described above. The organic compounds may or may not be dissolved in a solvent. The difference being that the organic compounds are sprayed onto a spinning substrate, and the solvent is allowed to evaporate during deposition. The process occurs in a partial vacuum. The substrate often spins at a rate of about 50–100 rpm, and as high as 600 rpm. The organic compounds are forced through heated nozzles. The nozzles heat the liquid to the vapor point, and the vaporized compounds mix in a mixing chamber. Other compounds may be optionally added in the mixing chamber, such as nitrogen, ammonia, or dopants. The substrate surface is heated to a temperature of about 500 to 700° C. to cause pyrolysis. The organic compounds must be pyrolyzed in order to leave behind the desired metal oxide composition. In many MOCVD processes the organic constituents are engineered to be chemically bound into the same organic compound and sometimes each constituent is sprayed onto the substrate through separate nozzles.

EXAMPLES

The following examples are given to illustrate various embodiments within the scope of the present invention. These are given by way of example only, and it is to be understood that the following examples are not comprehensive or exhaustive of the many embodiments within the scope of the present invention.

While the following Examples relate to the deposition of p-type or n-type doped single crystal zinc oxide, it will be appreciated that the Examples can be modified to provide deposition of undoped single crystal zinc oxide.

Many of the following Examples involve sputtering. FIG. 1 illustrates a schematic representation of a sputtering system 10 used in some of the following examples. In RF sputtering, a substrate 12 is placed in a low-pressure chamber 14. The magnetron sputtering head 16 is driven by an RF power source (not shown) which generates a plasma and ionization of the sputtering gas or gases between the electrodes. The sputtering gas typically includes an inert sputtering gas, which may include, but is not limited to, argon, krypton, xenon, neon, and helium. The sputtering gas may optionally include one or more selected dopants. A plurality of gas sources 18, 20, 22, and 24 may provide $N_2$, $H_2$, Ar, $O_2$, or other desired gases. For RF sputtering, a high-frequency generator is used generating electromagnetic power in the MHz-Region. Argon ions bombard the target 26, releasing ions from the target which are accelerated towards the substrate. Additional atoms in the plasma may also be deposited onto the substrate, such as dopant atoms.

In the sputtering system of FIG. 1, the substrate 12 is secured in place by a heated substrate fixture 28. The temperature of the heated substrate fixture 28 was measured and reported as the substrate temperature. The sputtering chamber 14 is constantly evacuated with a vacuum pump system 30. The sputtering atmosphere includes an inert sputtering gas mentioned above, and may optionally include other gases which are provided by the respective gas source 18, 20, 22, and 24. The gas pressures reported below, such as 10 mtorr, represent the gas pressure of the respective gas as it is introduced into the sputtering chamber 14. In some embodiments, volatile materials 32, such as arsenic for example, are evaporated in a heated basket, illustrated as the heated evaporator 34. The system includes online pressure measurement 36. It also includes thickness measurement capability 38. The system optionally includes an online mass spectrometer 40 which may measure the gas content and accurately determine the partial pressure of the sputtering atmosphere.

Unless specifically noted, the following are common conditions for the sputtering described in the Examples:

1. The distance between the sputtering target and the deposition substrate was about 1.5 inches.

2. Radio Frequency was 13.56 MHz. It will be appreciated by those skilled in the art that much lower and much higher frequencies may be used in RF sputtering systems. However, for practical considerations and FCC regulations, the radio frequency used was 13.56 MHz.

3. The atmosphere was maintained by using a continuous vacuum, and pressures were controlled by addition of indicated gases. Some residual atmospheric oxygen or moisture adsorbs on the metal surfaces within the sputtering chamber. Therefore, oxygen out gases during the sputtering process at the operating temperature and pressure.

4. The sputtering time was typically about 10 minutes, but some samples were sputtered for longer time periods, such as an hour, and some samples were sputtered for shorter periods, such as one minute. The sputtering time was selected to produce a film thickness of about one micron. It will be appreciated that several factors affect the film thickness, including, but not limited to, sputtering time, power, temperature, concentration of dopants, and evaporation of constituents of the sputtered thin film.

5. One inch RF magnetron sputtering head was used with water cooling.

6. All samples were tested for semiconductor type by Seebeck and Hall measurement.

7. All chemicals were high purity from Alfa Aesar.

8. In most cases, the operating condition ranges and experimental result ranges are drawn from multiple experiments. Thus, the reported examples and results may represent a composite of several actual experiments.

Example 1

Sputtering of ZnO

A thin film of undoped zinc oxide was deposited onto a self supporting substrate by RF sputtering. Both fused silica and silicon wafers were used as the self supporting substrate. The sputtering target composition was ZnO. The substrate temperature was between 350 and 550° C. The preferred temperature was about 400° C. The RF power was between 20 and 120 watts. The preferred power was about 60 watts. The sputtering atmosphere included argon at a gas pressure of about 4 to 20 mtorr and $O_2$ at a gas pressure of about 1 to 4 mtorr. The preferred sputtering atmosphere pressures were about 9 mtorr argon and about 1 mtorr $O_2$.

Example 2

Sputtering of ZnO with Arsenic as a Dopant

A thin film of p-type zinc oxide was deposited onto a self supporting substrate by RF sputtering. Both fused silica and silicon wafers were used as the self supporting substrate.

The sputtering target composition was ZnO (0.99–0.95 moles)+As (0.01–0.05 moles). The preferred target composition was ZnO (0.98 moles)+As (0.02 moles). The substrate temperature was between 350 and 550° C. The preferred temperature was about 400° C. The RF power was between 20 and 120 watts. The preferred power was about 60 watts. The sputtering atmosphere included argon at a gas pressure of about 4 to 20 mtorr and $O_2$ at a gas pressure of about 1 to 4 mtorr. The preferred sputtering atmosphere pressures were about 9 mtorr argon and about 1 mtorr $O_2$.

The resulting transparent p-type zinc oxide layer had a resistance of about 10,000 ohms/square. After annealing at 440° C. in air, the resistance dropped to about 1,000 ohms/square. In another composition prepared in accordance with the procedure of this Example, the transparent p-type zinc oxide layer had a resistance ranging from 200,000 ohms/square to 10,000,000 ohms/square. This composition was not subsequently annealed.

Example 3

Sputtering of ZnO with Arsenic as a Dopant

A thin film of p-type zinc oxide was deposited onto a self supporting substrate by RF sputtering. Both fused silica and silicon wafers were used as the self supporting substrate. The sputtering target composition was ZnO (0.99–0.95 moles)+As (0.01–0.05 moles). The preferred target composition was ZnO (0.98 moles)+As (0.02 moles). The substrate temperature was between 350 and 550° C. The preferred temperature was about 400° C. The RF power was between 20 and 120 watts. The preferred power was about 60 watts. The sputtering atmosphere included argon at a gas pressure of about 4 to 20 mtorr and $H_2$ at a gas pressure of about 1 to 4 mtorr. The preferred sputtering atmosphere pressures were about 9 mtorr argon and about 1 mtorr $H_2$.

The resulting transparent p-type zinc oxide layer had a resistance of about 500 ohms/square. Without being bound by theory, it is believed that the hydrogen gas may moderate the concentration of oxygen in the sputtering atmosphere.

Example 4

Sputtering of ZnO with Arsenic as a Dopant

A thin film of p-type zinc oxide was deposited onto a self supporting substrate by RF sputtering. Both fused silica and silicon wafers were used as the self supporting substrate. A First Composition Layer comprising zinc and arsenic was deposited onto the self supporting substrate.

In one example, the First Composition Layer was deposited by thermal evaporation of zinc arsenide ($Zn_3As_2$ or $ZnAs_2$) for a period of about 2–60 seconds, with a preferred period of about 14 seconds. The substrate temperature was about 360° C. Subsequent analysis of the First Composition Layer indicated that it contained zinc and arsenic in approximately equal atomic amounts. This suggests that the stoichiometry of the zinc arsenide had changed during thermal evaporation.

Thermal evaporation is a well known technique for depositing thin films, particularly metal and metal alloys. The following sequential basic steps take place: (i) a vapor is generated by boiling or subliming a source material, (ii) the vapor is transported from the source to the substrate, and (iii) the vapor is condensed to a solid film on the substrate surface. In the evaporative deposition process, a substrate is placed in a low-pressure chamber. A tungsten crucible is disposed below the substrate. The desired source material or mixture of source materials is placed in the crucible and heated to a temperature sufficiently high to evaporate the source material. The source material vapor condenses on the substrate, which may or may not be heated. Heating the substrate may enhance the bond between the deposited source material film and the substrate. The evaporative deposition process may be completed in less than a minute, and usually a few seconds.

In another example, the First Composition Layer was deposited by RF sputtering. In yet another example, the First Composition Layer was deposited by the combination of thermal evaporation and RF sputtering. It will be appreciated that the First Composition Layer may be deposited using other known, conventional, or novel deposition techniques, including, but not limited to, RF sputtering and evaporative deposition techniques described above, as well as chemical vapor deposition (CVD), metal organic chemical vapor deposition (MOCVD), other evaporation and sputtering techniques, and combinations of these and other thin film deposition technologies.

Preparing a thin film by evaporation alone is a very quick process that is completed in a matter of seconds, but it is difficult to properly control the resulting thin film. In contrast, sputtering alone is a slow process that requires many minutes to complete. The combination of sputtering and thermal evaporation includes heat to facilitate evaporation of the source material and a RF field to induce sputtering. Alternatively, the RF field can be used to heat the source material disposed close to the RF magnetron head sufficiently to evaporate the source material for deposition by thermal evaporation. In this case, a small amount of sputtering will also occur. The resulting thin film is of good quality and quickly prepared. In this case, the combination of sputtering and evaporation was used to deposit $Zn_3As_2$ onto a fused silica substrate at 350° C. for about 50 seconds.

A Second Composition Layer comprising zinc oxide was deposited onto the First Composition Layer by RF sputtering. The sputtering target composition was ZnO. The substrate temperature was between 400 and 550° C. The preferred temperature was about 450° C. The RF power was between 20 and 120 watts. The preferred power was about 100 watts. The sputtering time was between 10 and 40 minutes, and preferably about 20 minutes. The sputtering atmosphere included argon at a gas pressure of about 4 to 20 mtorr. The preferred sputtering atmosphere pressure was about 10 mtorr argon.

Figure 2:
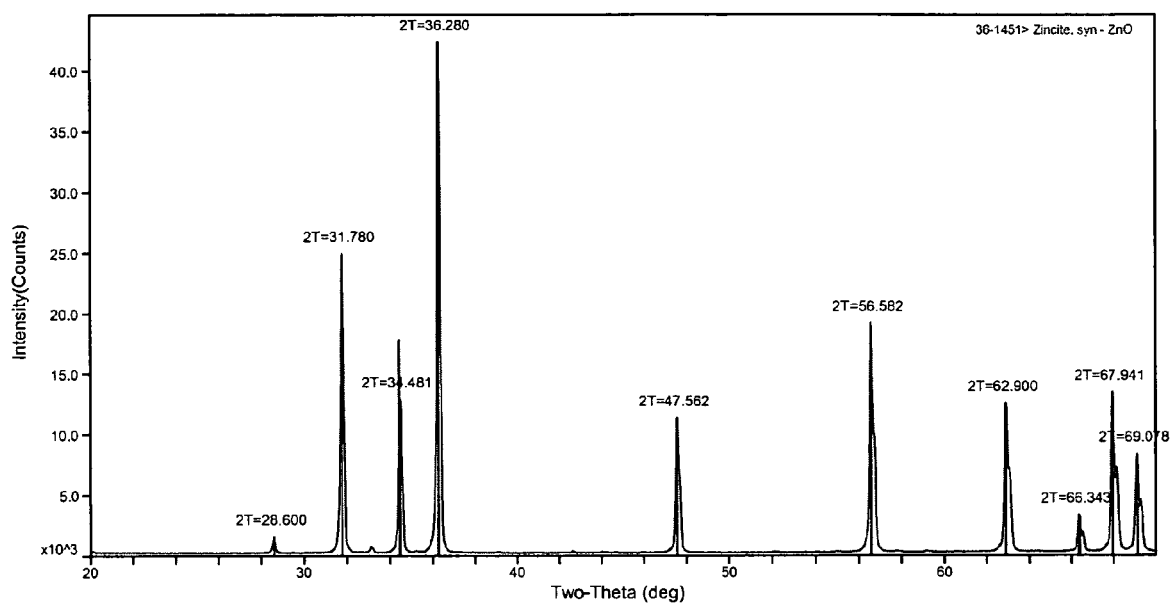
FIG. 2 is graph of the X-ray diffraction pattern generated by sputtered arsenic doped polycrystalline zinc oxide.
Figure 3:
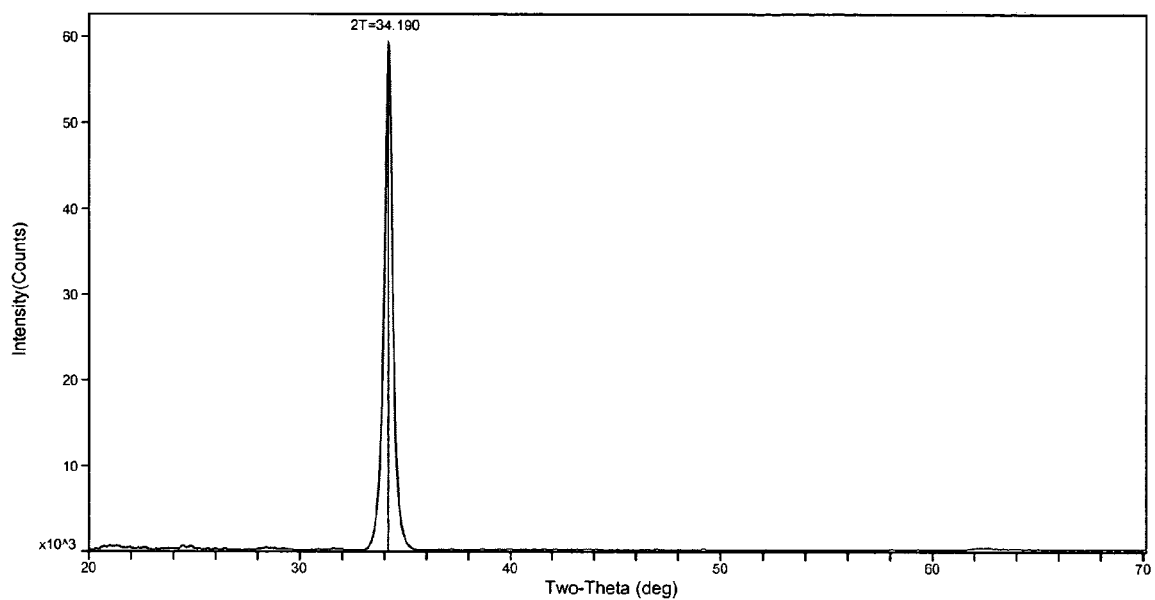
FIG. 3 is a graph of the X-ray diffraction pattern generated by a zinc oxide thin film within the scope of the present invention showing single crystal (002) plane.

A region of the arsenic doped p-type zinc oxide that was sputtered directly onto a fused silica substrate was analyzed by X-ray diffraction. A graph of the X-ray diffraction pattern is shown in FIG. 3 illustrating a single dominant peak representing the (002) plane. This indicates that single crystal p-type zinc oxide was deposited directly onto the amorphous fused silica substrate. By way of comparison, an X-ray diffraction pattern of polycrystalline zinc oxide is shown in FIG. 2.

Example 5

Sputtering of ZnO with Arsenic as a Dopant

A thin film of p-type zinc oxide was deposited onto a self supporting substrate by RF sputtering. Both fused silica and silicon wafers were used as the self supporting substrate. The sputtering target composition was Zn (0.99–0.95 moles)+$As_2O_3$ (0.01–0.05 moles). The preferred target composition was about Zn (0.99 moles)+$As_2O_3$ (0.01 moles).

The substrate temperature was between 350 and 550° C. The preferred temperature was about 400° C. The RF power was between 15 and 40 watts. The preferred power was about 30 Watts. A lower power was used in this example to keep the powdered zinc metal in the target from being quickly vaporized and dispersed during the sputtering processing. The sputtering atmosphere included argon at a gas pressure of about 4 to 20 mtorr and $O_2$ at a gas pressure of about 1 to 4 mtorr. The preferred sputtering atmosphere pressures were about 10 mtorr argon and about 1 mtorr $O_2$.

The resulting transparent p-type zinc oxide layer had a resistance of about 100,000 ohms/square.

Example 6

Sputtering of ZnO with Arsenic as a Dopant

A thin film of p-type zinc oxide was deposited onto a self supporting substrate by RF sputtering. Both fused silica and silicon wafers were used as the self supporting substrate. The sputtering target composition was ZnO (0.99–0.95 moles)+$As_2O_3$ (0.01–0.05 moles). The preferred target composition was ZnO (0.99 moles)+$As_2O_3$ (0.01 moles). The substrate temperature was between 350 and 550° C. The preferred temperature was about 400° C. The RF power was between 20 and 120 watts. The preferred power was about 60 watts. The sputtering atmosphere included argon at a gas pressure of about 4 to 20 mtorr. The preferred sputtering atmosphere pressure was about 10 mtorr argon.

The resulting transparent p-type zinc oxide layer had a resistance of about 100,000 ohms/square.

Example 7

Sputtering of ZnO with Antimony as a Dopant

A thin film of p-type zinc oxide was deposited onto a self supporting substrate by RF sputtering. Both fused silica and silicon wafers were used as the self supporting substrate. The sputtering target composition was Zn (0.99–0.95 moles)+Sb (0.01–0.05 moles). The preferred target composition was Zn (0.99 moles)+Sb (0.01 moles). The substrate temperature was between 350 and 550° C. The preferred temperature was about 400° C. The RF power was between 20 and 120 watts. The preferred power was about 60 watts. The sputtering atmosphere included argon at a gas pressure of about 4 to 20 mtorr. The preferred sputtering atmosphere pressure was about 10 mtorr argon.

The resulting transparent p-type zinc oxide layer had a resistance of about 600,000 ohms/square. Without being bound by theory, it is believed that the oxygen needed to form the zinc oxide crystal lattice was obtained from residual oxygen in the sputtering system atmosphere.

The target composition is not limited to metallic zinc and antimony. The target may comprise zinc oxide and antimony metal, zinc metal and antimony oxide, and zinc oxide and antimony oxide. The sputtering atmosphere may include hydrogen gas at a gas pressure of about 0.1 to 4 mtorr in addition to the inert sputtering gas. Antimony-doped zinc oxide may also be prepared in a manner similar to Example 4 in which a First Composition Layer containing zinc and antimony is deposited. Antimony-doped zinc oxide has been prepared in a manner similar to Example 4 in which the First Composition Layer contains just antimony.

Example 8

Sputtering of ZnO with Copper as a Dopant

A thin film of p-type zinc oxide was deposited onto a self supporting substrate by RF sputtering. Both fused silica and silicon wafers were used as the self supporting substrate. A First Composition Layer comprising copper was deposited onto the self supporting substrate by RF sputtering for a period of from 5 to 40 minutes, with a preferred period of about 10 minutes at room temperature.

A Second Composition Layer comprising zinc oxide was deposited onto the First Composition Layer by RF sputtering. The sputtering target composition was ZnO. The substrate temperature was between 400 and 550° C. The preferred temperature was about 450° C. The RF power was between 20 and 120 watts. The preferred power was about 100 watts. The sputtering time was between 10 and 40 minutes, and preferably about 20 minutes. The sputtering atmosphere included argon at a gas pressure of about 4 to 20 mtorr. The preferred sputtering atmosphere pressure was about 10 mtorr argon.

At low concentration, copper may counteract the natural n-type property of ZnO resulting in a neutral or p-type semiconductor with low resistance. Without being bound by theory, it is believed that a quantity of copper may be evaporated during the sputtering step and become part of the sputtering plasma such that ZnO doped with copper was deposited onto substrate.

Example 9

Sputtering of ZnO with Arsenic as a Dopant

A thin film of p-type zinc oxide was deposited- onto a self supporting substrate by RF sputtering. Both fused silica and silicon wafers were used as the self supporting substrate. A First Composition Layer comprising zinc and arsenic was deposited onto the self supporting substrate. The First Composition Layer included $Zn_3As_2$, $ZnAs_2$, or a mixture thereof. In one example, the zinc/arsenic layer was deposited by thermal evaporation for a period of about 2–60 seconds, with a preferred period of about 14 seconds. The temperature was about 360° C. The First Composition Layer may also be deposited by RF sputtering.

A Second Composition Layer comprising zinc oxide was deposited onto the First Composition Layer by RF sputtering. The sputtering target composition was ZnO. The substrate temperature was between 400 and 550° C. The preferred temperature was about 450° C. The RF power was between 20 and 120 watts. The preferred power was about 100 watts. The sputtering time was between 10 and 40 minutes, and preferably about 20 minutes. The sputtering atmosphere included argon at a gas pressure of about 4 to 20 mtorr and hydrogen at a gas pressure of about 0.1 to 4 mtorr. The preferred sputtering atmosphere pressure was about 10 mtorr argon and about 1 mtorr hydrogen.

The resulting p-type zinc oxide layer had a resistance of about 10 to 200 ohms/square.

Example 10

Sputtering of ZnO with Arsenic as Dopant

A thin film of p-type zinc oxide was deposited onto a self supporting substrate by RF sputtering. Fused silica was used as the self supporting substrate. The sputtering target composition was ZnO. The substrate temperature was between 350 and 550° C. The preferred temperature was about 400° C. The RF power was between 20 and 120 watts. The preferred power was about 60 watts. The sputtering atmosphere included argon at a gas pressure of about 4 to 20 mtorr. In addition, a basket containing arsenic was heated to a controlled temperature sufficient to evaporate the arsenic. The basket was positioned such that the arsenic was evaporated directly onto the fused silica at the same time the zinc oxide was sputtered onto the fused silica.

The resulting transparent p-type zinc oxide layer displayed visible diffraction rings, but was very clear and transparent. It will be appreciated that this process may be adapted for use with other p-type dopants besides arsenic.

Based upon arsenic vapor pressure data, $As_4$ has a higher vapor pressure at a given temperature when compared to $As_3$, $As_2$, and As. Therefore, it is presently believed that $As_4$ is the dominant volatile arsenic species at typical operating conditions. Without being bound by theory, it is believed $As_4$ must be broken into individual arsenic atoms to be incorporated into the zinc oxide. An apparent threshold RF power of about 60 watts has been observed for the given experimental sputtering system used herein. It will be appreciated that this threshold RF power may vary depending upon the sputtering system used. Likewise, it will be appreciated that other means besides a RF field may be used to break the $As_4$ molecular bonds.

A similar phenomenon has been observed with respect to antimony vapor pressures as with arsenic discussed above. Antimony generally requires a higher temperature to achieve the same vapor pressure as arsenic. Likewise, an apparent threshold RF power of about 90 watts has been observed for the given experimental sputtering system used herein.

Example 11

Evaporative Deposition of ZnO with Arsenic as a Dopant

A stable, p-type zinc oxide semiconductor material was prepared. Zinc metal, doped with 2 mole % arsenic, was deposited onto a fused silica substrate by thermal evaporation in an oxygen-rich atmosphere containing 20 mtorr argon and 10 mtorr oxygen at a temperature of about 430° C. During the deposition process, the zinc and/or arsenic was partially oxidized. The resulting As-doped ZnO thin film exhibited p-type characteristics. It had a Seebeck voltage of about positive 6 mV D.C. Increasing the oxygen pressure may result in a more complete formation of ZnO. While no further heating or annealing was performed in this example, additional heating or annealing may be desirable to control the level of zinc oxidation and/or optimize the electronic properties of the p-type semiconductor material.

Example 12

Spin Coating of Arsenic-Doped ZnO

A stable, p-type zinc oxide semiconductor material may be prepared by spin coating using arsenic as the dopant. Fused silica is used as the self supporting substrate. Zinc 2–4 pentanedionate is used as the zinc source and arsenic III ethoxide is used as the arsenic source. These compounds are dissolved in butanol which serves as a common solvent. This solution is spun onto a fused silica slide.

After a layer is spun on the substrate, it is heated to about 600° C. for about 10 minutes for pyrolysis of the organics. This procedure is repeated 5 or 6 times to get the desired film thickness. The substrate is annealed at about 700° C. for 1 to 5 hours in a nitrogen atmosphere. Control of the partial pressures of all inorganic components is desirable for the desired doped zinc oxide composition, otherwise evaporation or one or more ingredients or formation of undesired compounds may occur. The oxygen can come from the atmosphere or can come from being part of the organic precursors.

Example 13

Spin Coating of Antimony-Doped ZnO

A stable, p-type zinc oxide semiconductor material may be prepared by spin coating in accordance with the method of Example 12, except that antimony is used as the dopant instead of arsenic. Antimony chloride ($SbCl_3$) is used as the antimony source.

Example 14

MOCVD of P-Type ZnO

A stable, p-type zinc oxide semiconductor material may be prepared by metal organic chemical vapor deposition (MOCVD) using arsenic, antimony, or other p-type dopant. The typical MOCVD process is described above.

Example 15

Fabrication of Zinc Oxide P/N Junction

A zinc oxide p/n junction was fabricated. A thin film of p-type zinc oxide was deposited onto a self supporting silicon wafer substrate by RF sputtering in accordance with Example 4. In Example 4, a thin film of zinc arsenide was first deposited onto the silicon wafer and the p-type zinc oxide was sputtered on top of the zinc arsenide. A thin film of n-type zinc oxide was sputtered on top of the p-type zinc oxide at about 300° C. The sputtering target included ZnO (99.925 mole %) and $Ga_2O_3$ (0.075 mole %) that had been mixed, sintered, and annealed at about 1100° C. The sputtering step occurred at a temperature of about 350° C. The sputtering atmosphere included argon at a gas pressure of about 4 to 20 mtorr. About 10% hydrogen gas may alternatively be included in the sputtering atmosphere to produce n-type zinc oxide. Electrodes were attached to the p/n junction. Current vs. voltage was measured to show rectification of the p/n junction. A luminescent emission at room temperature was briefly observed before the p/n junction failed. Failure occurred because the electrical resistance dropped too quickly allowing excessive current to overpower the p/n junction.

Figure 4:
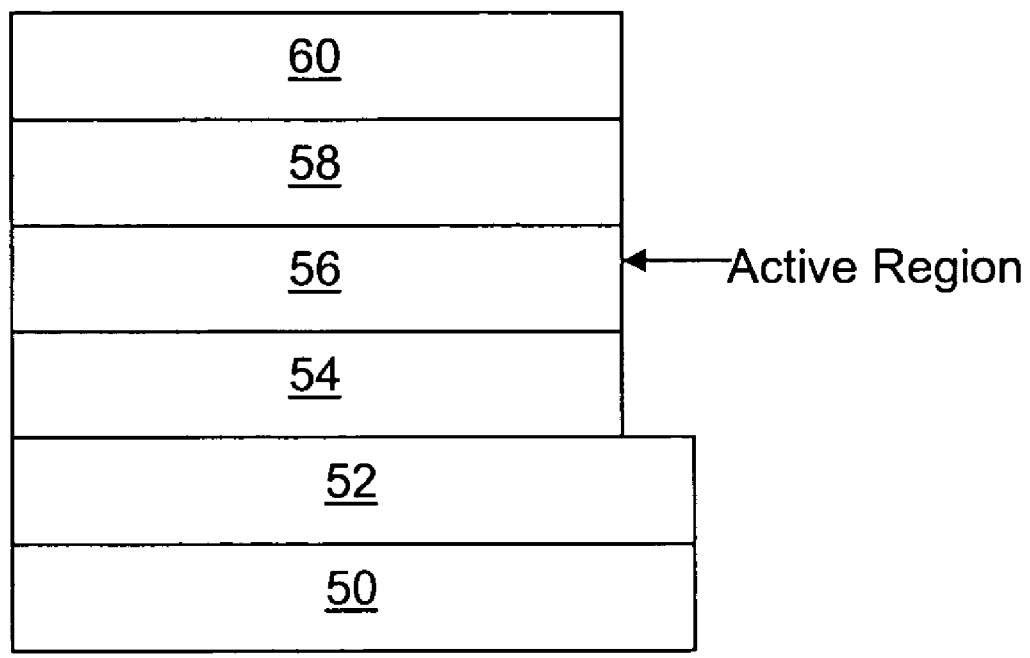
FIG. 4 is a schematic diagram of a zinc semiconductor heterostructure device containing an active region.
Figure 5:
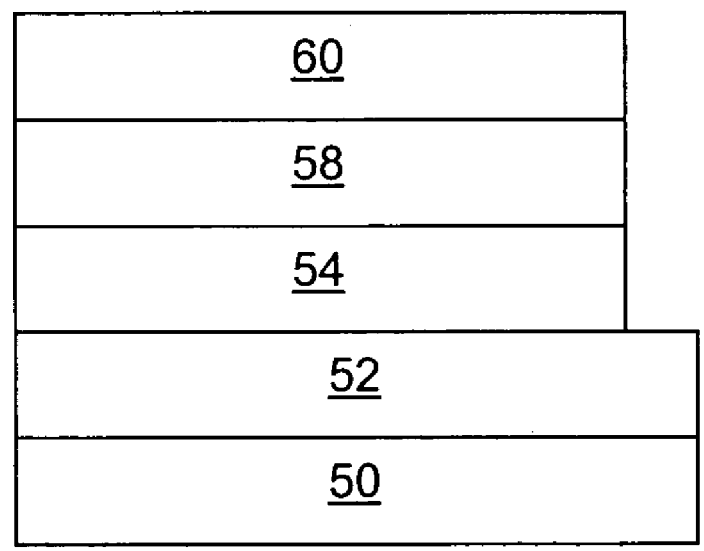
FIG. 5 is a schematic diagram of a zinc oxide semiconductor device of FIG. 3 without an active region.

Semiconductor heterostructures may be fabricated based upon p/n junction described above. These devices may be prepared by depositing multiple layers of p-type and n-type semiconductors. Such heterostructures may be fabricated using matching or compatible semiconductor crystals. Examples of two possible semiconductor heterostructure devices are illustrated in FIGS. 4 and 5. It will be appreciated that the illustrated devices are given by way of example and not limitation. Persons skilled in the art will recognize that numerous variations of these devices are possible.

The device shown in FIG. 4 includes a self supporting substrate 50. The substrate may be a known crystalline substrate or it may be a low cost substrate including, but not limited to, silicon wafers, polycrystalline alumina, and amorphous self supporting substrate surfaces like fused silica. A layer of n-type zinc oxide 52 doped with an n-type dopant, such as gallium, is deposited on the substrate 50. The n-type zinc oxide layer 52 may be about 0.4 µm thick. The device may include additional n-type zinc oxide layers 54, 56, comprising magnesium and cadmium alloys. For example, layer 54 may have a composition of $Mg_{.15}Zn_{.85}O$ doped with gallium, and it may have a thickness of about 0.15 µm. Layer 56 may have a composition of $Cd_{.06}Zn_{.94}O$ doped with gallium, and it may have a thickness of about 0.05 µm. The thin cadmium zinc oxide alloy layer 56 is the active region wherein light generation occurs. Deposited on top of the active region layer 56 are one or more p-type zinc layers 58, 60. Layer 58 may have a composition of $Mg_{.15}Zn_{.85}O$ doped with arsenic, and it may have a thickness of about 0.15 µm. Layer 60 may be p-type zinc oxide doped with a p-type dopant, such as arsenic.

It will be appreciated by persons having ordinary skill in the art that actual composition of the n-type and p-type zinc oxide layers may vary. Similarly the concentration of magnesium and cadmium in the zinc oxide alloys may vary.

FIG. 5 illustrates a device substantially identical to the device of FIG. 4, except that there is no separate active region.

Single or multiple quantum well (MQW) heterostructures may be fabricated to render the p/n junction more efficient. A single quantum well is made of two alternating semiconductor materials. One layer is a barrier layer defined by a higher band gap than the second layer. The second layer's band gap defines the bottom of the quantum well. For example, MgO may be alloyed with ZnO to form the barrier layer, and the undoped ZnO will define the bottom of the well. This produces a more efficient device and raises the band edge. Conversely, CdO may be alloyed with ZnO to define the bottom layer of the quantum well, and the undoped ZnO defines the barrier layer. This produces a more efficient device and lowers the band edge.

An additional advantage of a quantum well is that the layers can be mechanically strained to raise or lower the band edge. Mechanical strain may exist if the two layers have slightly different crystal lattice constants. For most zinc oxide materials the band edge is around 390 nm, but some of the zinc oxide semiconductor materials fabricated in accordance with the present invention had a band edge of about 370 nm.

The number of quantum wells may vary. Good results may be obtained with just one quantum well. Typically the number of quantum wells may range from about 1 to 10, and more preferably from about 3 to 7 quantum wells. The total thickness of the quantum well alternating layers must in the vicinity of, or less than, the electron de Broglie wavelength (100 Å). These heterostructures may be fabricated through a chemical deposition process, including but not limited to those described above, such as sputtering, CVD, MOCVD, etc.

Figures 6A, 6B:
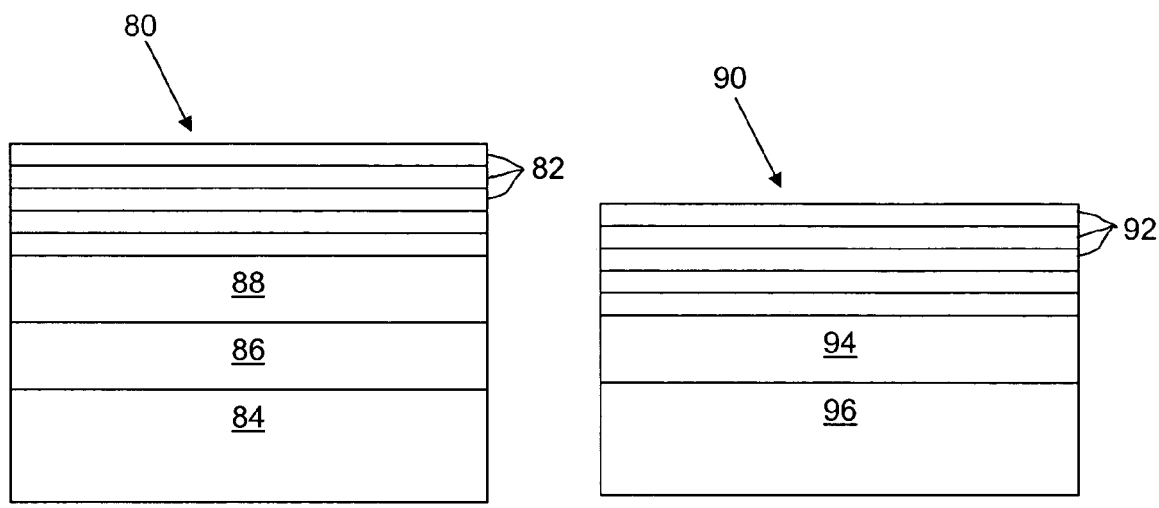
FIG. 6A is a schematic diagram of a conventional GaN solid state device fabricated on a sapphire or SiC substrate.
FIG. 6B is a schematic diagram of a ZnO solid state device fabricated on an alternative self-supporting substrate within the scope of the present invention.

FIG. 6A is a schematic representation of a typical state of the art GaN-based semiconductor device 80 containing MQWs 82. It will be appreciated that GaN devices are complicated to manufacture because of the expensive sapphire or SiC substrate 84 and multiple layers 86, 88 required to match the crystal lattice of GaN and the substrate. In contrast, FIG. 6B is a schematic representation of a zinc oxide based semiconductor device 90 containing MQWs 92. Because single crystal zinc oxide 94 may be deposited directly on a low-cost substrate 96, such as fused silica or a silicon wafer, the zinc oxide based semiconductor device fabricated within the scope of the present invention represents a substantial improvement over conventional GaN-based semiconductor devices.

Figure 7A:
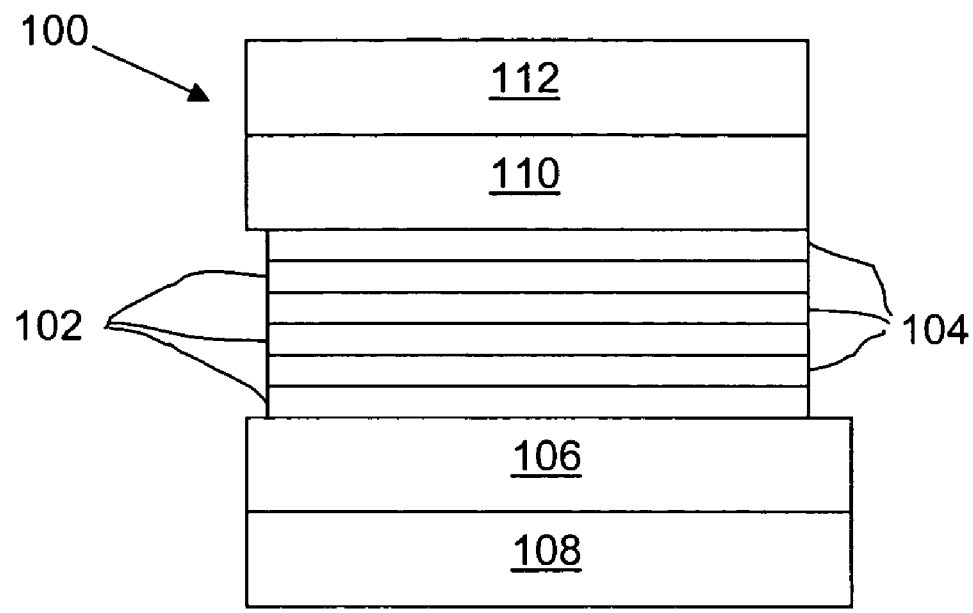
FIGS. 7A–7B are schematic representations of zinc oxide semiconductor devices fabricated with multiple quantum wells.

FIG. 7A is a schematic representation of one possible zinc oxide based semiconductor device 100 fabricated with MQWs. Three quantum wells are shown containing alternating layers of undoped ZnO 102 (20 Å–100 Å) and $Cd_{.2}Zn_{.8}O$ 104 (10 Å–25 Å). The cadmium content may be varied. The amount of cadmium in the cadmium zinc oxide alloy 104 may vary depending on the desired shifting of the band gap. The cadmium content preferably ranges from about 1 to 20 mole %, and more typically about 10 mole %.

The semiconductor device 100 includes a layer of n-type zinc oxide 106, approximately 2 µm thick, doped with an n-type dopant, such as Ga or Al, deposited on a self supporting substrate 108. A layer of p-type zinc oxide 110, approximately 2 µm thick, doped with a p-type dopant, such as arsenic, may be deposited on top of the MQWs, layers 102, 104. A layer of p-type zinc oxide 112, approximately 5 µm thick, doped with a p-type dopant, such as arsenic, may be deposited on top of layer 110.

Figure 7B:
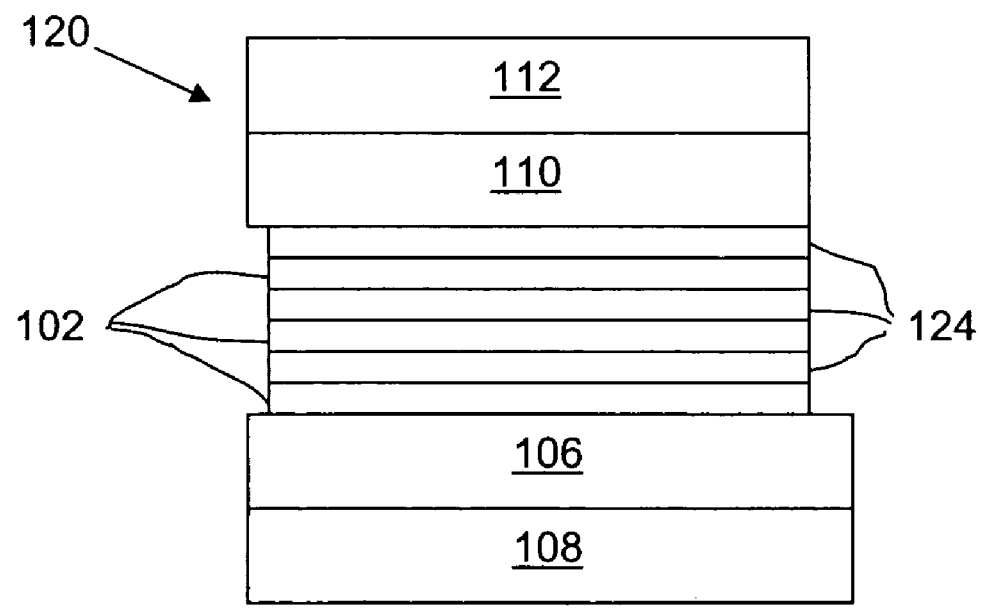

FIG. 7B is a schematic representation of a zinc oxide based semiconductor device 120 similar to that of FIG. 7A except that the quantum wells include a magnesium zinc oxide alloy instead of a cadmium zinc oxide alloy. The alternating layers of magnesium zinc oxide alloy 124 may have the formula $Mg_{.1}Zn_{.9}O$ (10 Å–25 Å). The magnesium content may be varied. The amount of magnesium the magnesium zinc oxide alloy 124 may vary depending on the desired shifting of the band gap. The magnesium content preferably ranges from about 1 to 20 mole %, and more typically about 10 mole %.

Figure 8A:
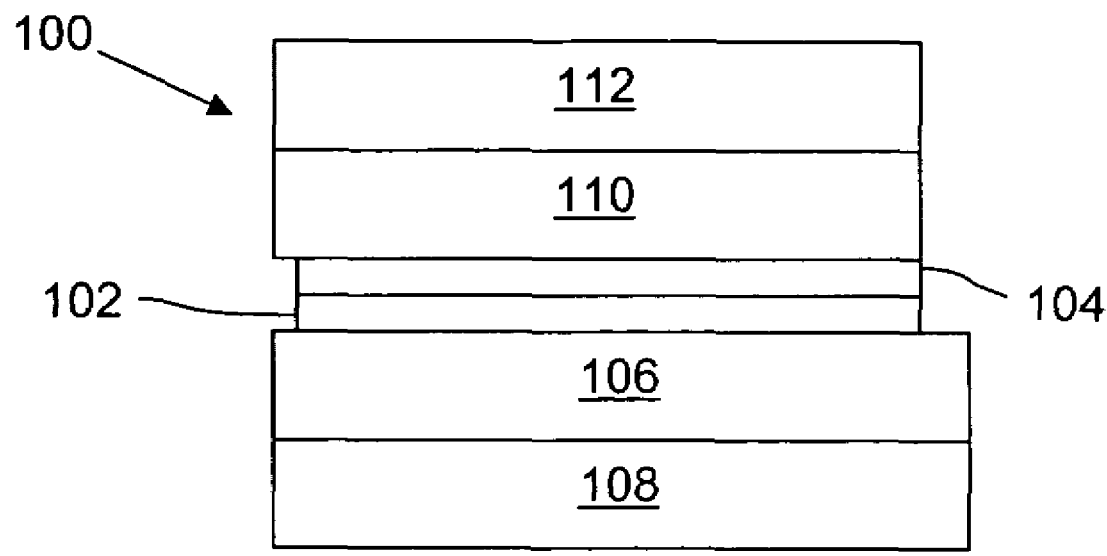
FIGS. 8A–8B are schematic representations of zinc oxide semiconductor devices fabricated with a single quantum well.

FIG. 8A is a schematic representation of one possible zinc oxide based semiconductor device fabricated with a single quantum well having a composition substantially the same as the device shown in FIG. 7A. As mentioned above, the number of quantum wells can vary, just as the composition of the quantum well layers and the p-type and n-type semiconductor material used in the device.

Figure 8B:
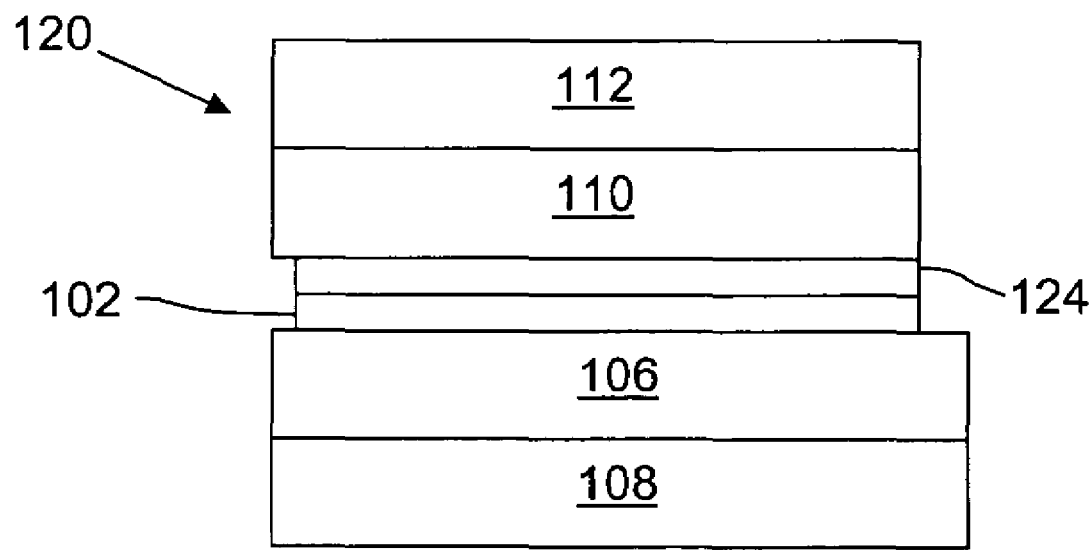

FIG. 8B is a schematic representation of a zinc oxide based semiconductor device similar to that of FIG. 8A except that the quantum well includes a magnesium zinc oxide alloy instead of a cadmium zinc oxide alloy.

It will be appreciated that the present invention provides zinc oxide crystal growth substrates useful for a variety of different applications. The zinc oxide substrates are commercially viable.

The present invention may be embodied in other specific forms without departing from its structures, methods, or other essential characteristics as broadly described herein and claimed hereinafter. The described embodiments are to be considered in all respects only as illustrative, and not restrictive. The scope of the invention is, therefore, indicated by the appended claims, rather than by the foregoing description. All changes that come within the meaning and range of equivalency of the claims are to be embraced within their scope.

The invention claimed is:

1. A single crystal zinc oxide substrate comprising:
 an amorphous self supporting fused silica ($SiO_2$) substrate surface; and
 a thin layer of single crystal zinc oxide deposited on the substrate surface by a chemical deposition process, wherein the thin layer of zinc oxide has a crystal lattice which permits the crystal growth of a crystal compatible with zinc oxide.

2. A single crystal zinc oxide substrate according to claim 1, wherein the single crystal zinc oxide is oriented in the (002) plane.

3. A single crystal zinc oxide substrate according to claim 1, wherein the compatible crystal has a lattice parameter within about 5% of a corresponding lattice parameter of the zinc oxide.

4. A single crystal zinc oxide substrate according to claim 1, wherein the compatible crystal comprises GaN.

5. A single crystal zinc oxide substrate according to claim 1, wherein the compatible crystal comprises epitaxial GaN.

6. A single crystal zinc oxide substrate according to claim 1, wherein the compatible crystal is selected from AlN, SiC, and GaN.

7. A single crystal zinc oxide substrate according to claim 1, wherein the compatible crystal comprises p-type or n-type ZnO.

8. A single crystal zinc oxide substrate according to claim 1, wherein the chemical deposition process is selected from RF sputtering, CVD (chemical vapor deposition), MOCVD (metal organic chemical vapor deposition), spin coating, electrophoresis, and hydrothermal growth processes.

9. A single crystal zinc oxide substrate according to claim 1, wherein the thin layer of zinc oxide has a thickness less than about 5 µm.

10. A single crystal zinc oxide substrate according to claim 1, wherein the thin layer of zinc oxide has a thickness greater than about 5 µm.

11. A single crystal zinc oxide substrate according to claim 1, wherein the chemical deposition process comprises RF sputtering using an RF sputtering system comprising a zinc metal target, a substrate surface, and a plasma comprising oxygen and an inert sputtering gas, wherein the RF sputtering system is operated at conditions which produce the thin layer of single crystal zinc oxide on the substrate surface.

12. A single crystal zinc oxide substrate according to claim 11, wherein the inert sputtering gas is selected from argon, krypton, xenon, neon, and helium.

13. A single crystal zinc oxide substrate according to claim 11, wherein the sputtering system was operated at a power in the range from about 20 watts to 150 watts.

14. A single crystal zinc oxide substrate according to claim 11, wherein the sputtering system was operated at a power in the range from 90 watts to 100 watts.

15. A single crystal zinc oxide substrate according to claim 11, wherein the sputtering system was operated at a RF frequency ranging of about 13.56 MHz.

16. A single crystal zinc oxide substrate according to claim 11, wherein the sputtering system was operated at a temperature in the range from about 300° C. to about 550° C.

17. A single crystal zinc oxide substrate according to claim 11, wherein the sputtering system was operated at a temperature in the range from about 350° C. to about 450° C.

18. A single crystal zinc oxide substrate according to claim 11, wherein the sputtering system was operated for a period from about 1 to about 40 minutes.

19. A single crystal zinc oxide substrate according to claim 11, wherein the sputtering system was operated for a period from about 1 to about 10 minutes.

20. A single crystal zinc oxide substrate according to claim 1, wherein the thin layer of single crystal zinc oxide comprises p-type zinc oxide.

21. A single crystal zinc oxide substrate comprising:
an amorphous self supporting substrate surface;
a thin layer of single crystal p-type zinc oxide deposited on the substrate surface by a chemical deposition process, wherein the thin layer of p-type zinc oxide has a crystal lattice which permits the crystal growth of a crystal compatible with zinc oxide; and
a thin layer of single crystal n-type zinc oxide deposited on the p-type zinc oxide.

22. A single crystal zinc oxide substrate according to claim 21, wherein the n-type zinc oxide contains an n-type dopant selected from ions of Al, Ga, B, H, Yb and other rare earth elements, Y, Sc, and mixtures thereof.

23. A single crystal zinc oxide substrate according to claim 1, wherein the thin layer of single crystal zinc oxide comprises n-type zinc oxide.

24. A single crystal zinc oxide substrate comprising:
A polycrystalline self supporting alumina substrate surface; and
a thin layer of single crystal zinc oxide deposited on the substrate surface by a chemical deposition process, wherein the thin layer of zinc oxide has a crystal lattice which permits the crystal growth of a crystal compatible with zinc oxide.

25. A single crystal zinc oxide substrate according to claim 24, wherein the single crystal zinc oxide is oriented in the (002) plane.

26. A single crystal zinc oxide substrate according to claim 24, wherein the compatible crystal has a lattice parameter within about 5% of a corresponding lattice parameter of the zinc oxide.

27. A single crystal zinc oxide substrate according to claim 24, wherein the compatible crystal comprises GaN.

28. A single crystal zinc oxide substrate according to claim 24, wherein the compatible crystal comprises epitaxial GaN.

29. A single crystal zinc oxide substrate according to claim 24, wherein the compatible crystal is selected from AlN, SiC, and GaN.

30. A single crystal zinc oxide substrate according to claim 24, wherein the compatible crystal comprises p-type or n-type ZnO.

31. A single crystal zinc oxide substrate according to claim 24, wherein the chemical deposition process is selected from RF sputtering, CVD (chemical vapor deposition), MOCVD (metal organic chemical vapor deposition), spin coating, electrophoresis, and hydrothermal growth processes.

32. A single crystal zinc oxide substrate according to claim 24, wherein the thin layer of zinc oxide has a thickness less than about 5 µm.

33. A single crystal zinc oxide substrate according to claim 24, wherein the thin layer of zinc oxide has a thickness greater than about 5 µm.

* * * * *